US010949579B2

(12) United States Patent
Wodrich et al.

(10) Patent No.: US 10,949,579 B2
(45) Date of Patent: *Mar. 16, 2021

(54) METHOD AND APPARATUS FOR ENHANCED POSITION AND ORIENTATION DETERMINATION

(71) Applicant: Middle Chart, LLC, Jacksonville, FL (US)

(72) Inventors: Michael A. Wodrich, Jacksonville, FL (US); Michael S. Santarone, Jacksonville, FL (US); Jason E. Duff, Jacksonville, FL (US); Fred Flitsch, New Windsor, NY (US); Randall Pugh, Jacksonville, FL (US)

(73) Assignee: Middle Chart, LLC, Jacksonville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/898,602

(22) Filed: Jun. 11, 2020

(65) Prior Publication Data

US 2020/0302093 A1 Sep. 24, 2020

Related U.S. Application Data

(63) Continuation-in-part of application No. 16/817,926, filed on Mar. 13, 2020, now Pat. No. 10,831,945, (Continued)

(51) Int. Cl.
*G06F 30/13* (2020.01)
*G06T 19/00* (2011.01)
(Continued)

(52) U.S. Cl.
CPC .............. *G06F 30/13* (2020.01); *G01S 19/48* (2013.01); *G06Q 99/00* (2013.01); *G06T 17/05* (2013.01); *G06T 19/006* (2013.01); *G01S 19/01* (2013.01)

(58) Field of Classification Search
CPC ......... G01S 19/01; G01S 19/48; G06Q 99/00; G06T 19/1006; G06T 17/05; G06F 30/13; G06F 3/00
See application file for complete search history.

(56) References Cited

U.S. PATENT DOCUMENTS 5,884,202 A 3/1999 Arjomand
5,933,479 A 8/1999 Michael et al.
(Continued)

FOREIGN PATENT DOCUMENTS

CN 102147597 A 8/2011
EP 2726817 B1 9/2018
(Continued)

OTHER PUBLICATIONS

"Wireless Indoor Localization Systems and Techniques: Survey and Comparative Study" Indonesian Journal of Electrical Engineering and Computer Science, vol. 3, No. 2, Aug. 2016, pp. 392-409 (Year: 2016).
(Continued)

*Primary Examiner* — Brandon J Miller
(74) *Attorney, Agent, or Firm* — Rogers Towers, P.A.; Joseph P. Kincart

(57) ABSTRACT

Apparatus and methods for enhanced wireless determination of a position and direction of a smart device. Wireless transceivers controlled by the smart device communicate with reference point transceivers to generate data sufficient to determine relative positions of the wireless transceivers and a direction of interest. Operation of one or both of a magnetic force sensor and LIDAR may be operative to verify the position and direction of the Smart Device.

20 Claims, 15 Drawing Sheets

Related U.S. Application Data which is a continuation-in-part of application No. 16/688,775, filed on Nov. 19, 2019, now Pat. No. 10,628,617, which is a continuation-in-part of application No. 16/657,660, filed on Oct. 18, 2019, which is a continuation-in-part of application No. 16/597,271, filed on Oct. 9, 2019, which is a continuation of application No. 16/161,823, filed on Oct. 16, 2018, now Pat. No. 10,467,353, which is a continuation-in-part of application No. 15/716,133, filed on Sep. 26, 2017, now Pat. No. 10,025,887, said application No. 16/161,823 is a continuation-in-part of application No. 15/703,310, filed on Sep. 13, 2017, said application No. 16/597,271 is a continuation of application No. 15/887,637, filed on Feb. 2, 2018, which is a continuation of application No. 15/716,133, filed on Sep. 26, 2017, now Pat. No. 10,025,887, and a continuation of application No. 15/703,310, filed on Sep. 13, 2017, said application No. 16/657,660 is a continuation-in-part of application No. 16/549,503, filed as application No. PCT/US2019/033134 on May 20, 2019, which is a continuation of application No. 16/297,383, filed on Mar. 8, 2019, now Pat. No. 10,762,251, which is a continuation-in-part of application No. 16/176,002, filed on Oct. 31, 2018, now Pat. No. 10,268,782, which is a continuation-in-part of application No. 16/171,593, filed on Oct. 26, 2018, now Pat. No. 10,620,084, which is a continuation-in-part of application No. 16/165,517, filed on Oct. 19, 2018, now Pat. No. 10,733,334, which is a continuation-in-part of application No. 16/161,823, filed on Oct. 16, 2018, now Pat. No. 10,467,353, and a continuation-in-part of application No. 16/142,275, filed on Sep. 26, 2018, now Pat. No. 10,433,112, and a continuation-in-part of application No. 15/887,637, filed on Feb. 2, 2018, said application No. PCT/US2019/033134 is a continuation of application No. 16/249,574, filed on Jan. 16, 2019, now Pat. No. 10,831,943, which is a continuation-in-part of application No. 16/176,002, filed on Oct. 31, 2018, now Pat. No. 10,268,782, said application No. 16/657,660 is a continuation-in-part of application No. 16/528,104, filed on Jul. 31, 2019, now Pat. No. 10,671,767, which is a continuation-in-part of application No. 16/504,919, filed on Jul. 8, 2019, now Pat. No. 10,740,502, which is a continuation-in-part of application No. 16/503,878, filed on Jul. 5, 2019, now Pat. No. 10,776,529, which is a continuation-in-part of application No. 16/297,383, filed on Mar. 8, 2019, now Pat. No. 10,762,251, and a continuation-in-part of application No. 16/249,574, filed on Jan. 16, 2019, now Pat. No. 10,831,943, application No. 16/898,602, which is a continuation of application No. 16/775,223, filed on Jan. 28, 2020, now Pat. No. 10,740,503, which is a continuation of application No. 16/721,906, filed on Dec. 19, 2019, now Pat. No. 10,726,167, which is a continuation of application No. 16/688,775, filed on Nov. 19, 2019, now Pat. No. 10,628,617.

(60) Provisional application No. 62/531,955, filed on Jul. 13, 2017, provisional application No. 62/531,975, filed on Jul. 13, 2017, provisional application No. 62/462,347, filed on Feb. 22, 2017, provisional application No. 62/909,061, filed on Oct. 1, 2019, provisional application No. 62/712,714, filed on Jul. 31, 2018, provisional application No. 62/793,714, filed on Jan. 17, 2019, provisional application No. 62/871,499, filed on Jul. 8, 2019, provisional application No. 62/769,133, filed on Nov. 19, 2018.

(51) Int. Cl.
  *G06Q 99/00* (2006.01)
  *G01S 19/48* (2010.01)
  *G06T 17/05* (2011.01)
  *G01S 19/01* (2010.01)

(56) References Cited

U.S. PATENT DOCUMENTS

| | | |
|---|---|---|
| 6,006,021 A | 12/1999 | Tognazzini |
| 6,292,108 B1 | 9/2001 | Straser et al. |
| 6,321,158 B1 | 11/2001 | DeLorme et al. |
| 6,853,958 B1 | 2/2005 | Turin et al. |
| 7,057,557 B2 | 6/2006 | Lee |
| 7,994,981 B1 | 8/2011 | Farrokhi et al. |
| 8,843,350 B2 | 9/2014 | Jacobi et al. |
| 8,965,741 B2 | 2/2015 | McCulloch et al. |
| 8,996,156 B2 | 3/2015 | Melzer-Jokisch et al. |
| 9,008,979 B2 | 4/2015 | Miura |
| 9,064,219 B2 | 6/2015 | Hall et al. |
| 9,342,928 B2 | 5/2016 | Rasane et al. |
| 9,529,072 B2 | 12/2016 | Matzner |
| 9,703,517 B2 | 7/2017 | Andolina |
| 9,772,396 B2 | 9/2017 | Liao et al. |
| 9,892,559 B2 | 2/2018 | Yoshida et al. |
| 9,934,335 B2 | 4/2018 | Pettersson |
| 10,042,341 B1 | 8/2018 | Jacob |
| 10,054,914 B2 | 8/2018 | Vartiainen et al. |
| 10,149,141 B1 | 12/2018 | Stamatakis et al. |
| 10,222,301 B2 | 3/2019 | Silva et al. |
| 10,355,351 B2 | 7/2019 | Cummings et al. |
| 10,444,324 B2 | 10/2019 | Dackefjord et al. |
| 2002/0095269 A1 | 7/2002 | Natalini et al. |
| 2002/0181405 A1 | 12/2002 | Ying |
| 2003/0110001 A1 | 6/2003 | Chassin et al. |
| 2003/0163440 A1 | 8/2003 | Tonack |
| 2004/0119662 A1 | 6/2004 | Dempski |
| 2004/0122628 A1 | 6/2004 | Laurie |
| 2005/0165576 A1 | 7/2005 | Jesmonth |
| 2005/0208951 A1 | 9/2005 | Annunziato et al. |
| 2005/0275525 A1 | 12/2005 | Ahmed |
| 2006/0028345 A1 | 2/2006 | Lee |
| 2006/0084436 A1 | 4/2006 | Green et al. |
| 2006/0084463 A1 | 4/2006 | Yoo et al. |
| 2007/0266395 A1 | 11/2007 | Lee et al. |
| 2008/0103835 A1 | 5/2008 | Corcoran et al. |
| 2008/0319654 A1 | 12/2008 | Shintani et al. |
| 2009/0097710 A1 | 4/2009 | Sroka et al. |
| 2009/0189810 A1 | 7/2009 | Murray |
| 2010/0103036 A1 | 4/2010 | Malone et al. |
| 2010/0271263 A1 | 10/2010 | Moshfeghi |
| 2010/0296075 A1 | 11/2010 | Hinderling et al. |
| 2010/0309044 A1 | 12/2010 | Ische et al. |
| 2011/0047516 A1 | 2/2011 | Pavan et al. |
| 2011/0068906 A1 | 3/2011 | Shafer et al. |
| 2011/0153101 A1 | 6/2011 | Thomas et al. |
| 2012/0087212 A1 | 4/2012 | Vartanian et al. |
| 2012/0204646 A1 | 8/2012 | Lee et al. |
| 2012/0214507 A1 | 8/2012 | Vartanian et al. |
| 2013/0010103 A1 | 1/2013 | Ihara et al. |
| 2013/0073059 A1 | 3/2013 | Brian et al. |
| 2013/0084886 A1 | 4/2013 | Crilly, Jr. et al. |
| 2013/0169681 A1 | 7/2013 | Rasane et al. |
| 2013/0197685 A1 | 8/2013 | Matsunaga et al. |
| 2013/0201311 A1 | 8/2013 | Hirakawa |
| 2013/0223261 A1 | 8/2013 | Aggarwal et al. |
| 2013/0288719 A1 | 10/2013 | Alonzo |
| 2013/0297555 A1 | 11/2013 | Fadell et al. |
| 2013/0345975 A1 | 12/2013 | Vulcano et al. |
| 2014/0084909 A1 | 3/2014 | Pagani |

(56) References Cited

U.S. PATENT DOCUMENTS

| | | |
|---|---|---|
| 2014/0107828 A1 | 4/2014 | Zhu et al. |
| 2014/0146038 A1 | 5/2014 | Kangas et al. |
| 2014/0156455 A1 | 6/2014 | Atwood et al. |
| 2014/0188394 A1 | 7/2014 | Febonio et al. |
| 2014/0210856 A1 | 7/2014 | Finn et al. |
| 2014/0244160 A1 | 8/2014 | Cragun et al. |
| 2014/0266755 A1 | 9/2014 | Arensmeier et al. |
| 2014/0274151 A1 | 9/2014 | Pattabiraman et al. |
| 2014/0277594 A1 | 9/2014 | Nixon et al. |
| 2014/0368373 A1 | 12/2014 | Crain et al. |
| 2015/0005903 A1 | 1/2015 | Worek et al. |
| 2015/0094081 A1* | 4/2015 | Gupta ............ H04W 64/003 455/456.1 |
| 2015/0094865 A1 | 4/2015 | Choi et al. |
| 2015/0116132 A1 | 4/2015 | Nohra et al. |
| 2015/0121222 A1 | 4/2015 | Lacaze et al. |
| 2015/0137967 A1 | 5/2015 | Wedig et al. |
| 2015/0142179 A1 | 5/2015 | Ito et al. |
| 2015/0154803 A1 | 6/2015 | Meier et al. |
| 2015/0177718 A1 | 6/2015 | Vartiainen et al. |
| 2015/0207316 A1 | 7/2015 | Saussele et al. |
| 2015/0227123 A1 | 8/2015 | Laycock et al. |
| 2015/0294506 A1 | 10/2015 | Bare et al. |
| 2015/0327010 A1 | 11/2015 | Gottschalk et al. |
| 2015/0347854 A1 | 12/2015 | Bare et al. |
| 2015/0356786 A1 | 12/2015 | Bare et al. |
| 2015/0356789 A1 | 12/2015 | Komatsu et al. |
| 2016/0026253 A1 | 1/2016 | Bradski et al. |
| 2016/0026729 A1 | 1/2016 | Gil et al. |
| 2016/0063671 A1 | 3/2016 | Piippo et al. |
| 2016/0066068 A1 | 3/2016 | Schultz et al. |
| 2016/0069675 A1 | 3/2016 | Bando et al. |
| 2016/0091217 A1 | 3/2016 | Verberkt et al. |
| 2016/0095188 A1 | 3/2016 | Verberkt et al. |
| 2016/0135006 A1* | 5/2016 | Fjeldsoe-Nielsen ............ H04W 4/023 455/456.3 |
| 2016/0178383 A1 | 6/2016 | Mays et al. |
| 2016/0183057 A1 | 6/2016 | Steiner |
| 2016/0216879 A1 | 7/2016 | Park et al. |
| 2016/0238692 A1 | 8/2016 | Hill et al. |
| 2016/0258760 A1 | 9/2016 | Beaumont et al. |
| 2016/0284075 A1 | 9/2016 | Phan et al. |
| 2016/0284128 A1 | 9/2016 | Michalscheck et al. |
| 2016/0285416 A1 | 9/2016 | Tiwari et al. |
| 2016/0323149 A1 | 11/2016 | Hu et al. |
| 2016/0335731 A1 | 11/2016 | Hall |
| 2016/0343093 A1 | 11/2016 | Riland et al. |
| 2016/0343243 A1 | 11/2016 | Rabb et al. |
| 2016/0360429 A1 | 12/2016 | Li et al. |
| 2017/0055126 A1 | 2/2017 | O'Keeffe |
| 2017/0079001 A1 | 3/2017 | Lewis |
| 2017/0115022 A1 | 4/2017 | Grosshart et al. |
| 2017/0131426 A1 | 5/2017 | Sgarz et al. |
| 2017/0169683 A1 | 6/2017 | Ryder |
| 2017/0200312 A1 | 7/2017 | Smith et al. |
| 2017/0234962 A1 | 8/2017 | Yang et al. |
| 2017/0237892 A1 | 8/2017 | Sakai |
| 2017/0286568 A1 | 10/2017 | Dean et al. |
| 2017/0289344 A1 | 10/2017 | Greenberger et al. |
| 2017/0363504 A1 | 12/2017 | Winant et al. |
| 2018/0018826 A1 | 1/2018 | Maier et al. |
| 2018/0035263 A1* | 2/2018 | Titus ............ H04W 4/35 |
| 2018/0048693 A1 | 2/2018 | Gulbinas et al. |
| 2018/0075168 A1 | 3/2018 | Tiwari et al. |
| 2018/0101803 A1 | 4/2018 | Tiwari et al. |
| 2018/0102858 A1 | 4/2018 | Tiwari et al. |
| 2018/0108079 A1 | 4/2018 | Traub |
| 2018/0130260 A1 | 5/2018 | Schmirler et al. |
| 2018/0131907 A1 | 5/2018 | Schmirler et al. |
| 2018/0159904 A1 | 6/2018 | Hu et al. |
| 2018/0285482 A1 | 10/2018 | Santos et al. |
| 2018/0295526 A1 | 10/2018 | Wills et al. |
| 2018/0328753 A1 | 11/2018 | Stenning et al. |
| 2018/0357823 A1 | 12/2018 | Koniki et al. |
| 2018/0374269 A1 | 12/2018 | Smith |
| 2019/0025905 A1 | 1/2019 | Godina et al. |
| 2019/0057169 A1 | 2/2019 | Santarone et al. |
| 2019/0096232 A1 | 3/2019 | Wedig et al. |
| 2019/0156576 A1 | 5/2019 | Ndolo |
| 2019/0228370 A1 | 7/2019 | Lien |
| 2019/0268062 A1 | 8/2019 | Josefiak |
| 2019/0294834 A1 | 9/2019 | Mountz |
| 2019/0355177 A1 | 11/2019 | Manickam et al. |
| 2019/0392088 A1 | 12/2019 | Duff et al. |

FOREIGN PATENT DOCUMENTS

| | | |
|---|---|---|
| GB | 2498177 A | 7/2013 |
| KR | 101354688 B1 | 1/2014 |
| WO | 2008124713 A2 | 10/2008 |
| WO | 2011019810 A1 | 2/2011 |
| WO | 2014204753 A1 | 12/2014 |
| WO | 2016130571 A1 | 8/2016 |
| WO | 2016192916 A1 | 12/2016 |
| WO | 2017149526 A2 | 9/2017 |
| WO | 2017223008 A1 | 12/2017 |

OTHER PUBLICATIONS

Amekudzi, Adjo A., Rebecca Shelton, and Tim R. Bricker. "Infrastructure Rating Tool: Using Decision Support Tools to EnhanceASCE Infrastructure Report Card Process." Leadership and Management in Engineering 13.2 (2013): 76-82. (Year: 2013).

ASCE 2014 Report Card of Montana's Infrastructure, accessed at https://www.infrastructurereportcard.org/wp-contentluploads/2014/11/2014-Report-Card-for-Montanas-Infrastructure.pdf (Year: 2014).

Aukstakalnis, Steve. Practical augmented reality: A guide to the technologies, applications, and human factors for AR and VR.Addison-Wesley Professional, 2016. (Year: 2016).

Carmelo Scuro et al., IoT for Structural Health Monitoring, Dec. 2018, IEEE Instrumentation & Measurement Magazine, pp. 4-14.

Dong et ai, "Evaluation of the Reliability of RSSI for Indoor localization", 2012, pp. 6. downloaded from the internet https://ieeexplore.ieee.org/documentl6402492 (Year 2012).

Gifford, Matthew, "Indoor Positioning with Ultrasonic/Ultrasound", 2018, Oct. 19, 7 pages, https://www.leverege.com/blogpost/ultrasonic-indoor-positioning.

Hexamite, "HX19V2 RFID Ultrasonic Positioning System", 1999, https://www.hexamite.com/hx19.htm.

Hu. Wi-Fi Based Indoor Positioning System Using Smartphones. Nov. 2013. [retrieved on Apr. 23, 2018]. Retrieved [from the Internet: (91 pages total).

International Search Report and Written Opinion dated Feb. 6, 2020 issued in connection with corresponding [International Application No. PCT/US2018/019185 (9 pages total).

International Search Report and Written Opinion dated Feb. 10, 2020 issued in connection with corresponding [International Application No. PCT/US2018/019154 (9 pages total).

International Search Report and Written Opinion dated May 14, 2018 issued in connection with corresponding International Application No. PCT/US2018/019154 (10 pages total).

International Search Report and Written Opinion dated May 7, 2018 issued in connection with corresponding [International Application No. PCT/US2018/019185 (7 pages total).

Khemapech et al., Bridge Structural Monitoring and Warning System Aplication in Thailand—Experiences Learned, 2017, TRON Forum ISBN 978-4-89362-330-0, pp. 1-8.

Kyle, "Property Management" Dearborn Real Estate, 2000— Business & Economics, pp. 40-41.

Liu etal.,"A Hybrid Smartphone Indoor Positioning Solution for Mobile LBS" Sensors 2012, issue 12, pp. 17208-17233 (Year: 2012).

Liu, "Survey of Wireless Based Indoor Localization Technologies" accessed at http://www.cse.wustl.edu/-jain/cse574-14/ftp/indoor/index.html, May 5, 2014,17 pg printout (Year: 2014).

Mordue, Stefan, Paul Swaddle, and David Philp. Building information modeling for dummies. John Wiley & Sons, 2015. (Year: 2015).

(56) References Cited

OTHER PUBLICATIONS

Qi, J.; Liu, G.-P. A Robust High-Accuracy Ultrasound Indoor Positioning System Based on a Wireless Sensor Network. Sensors 2017, 17, 2554.

Suermann, Patrick C. Evaluating the impact of building information modeling (BIM) on construction. Florida Univ Gainesvillegraduate School, 2009. (Year 2009).

Thomson, C. P. H. From Point Cloud to Building Information Model: Capturing and Processing Survey Data Towards Automation forHigh Quality 3D Models to Aid a BIM Process. Diss. UCL (University College London), 2016. (Year: 2016).

Wang et al. Performance Evaluation of Automatically Generated BIM from Laser Scanner Data for Sustainability Analyses. 2015. [retrieved on Apr. 23, 2018]. Retrieved from the Internet: . (8 pages total).

Wang, Siqi, Jinsheng Du, and Jianyong Song. "A Framework of BIM-Based Bridge Health Monitoring System." 2016 InternationalConference on Civil, Transportation and Environment. Atlantis Press, 2016. (Year: 2016).

Wikipedia article "Building Information Modeling", archive data Jan. 15, 2016 on the Wayback machine (Year: 2016).

Yang et ai, "Wi Fi-Based Indoor Positioning", 2015, pp. 150-157 downloaded from the Internet I EEE.com databases. (Year: 2015).

Zou et al., "SmartScanner: Know More in Walls with Your Smartphone!" IEEE Transactions on Mobile Computing, vol. 15, No. 11, Nov. 2016, pp. 2865-2877 (Year: 2016).

\* cited by examiner

METHOD AND APPARATUS FOR ENHANCED POSITION AND ORIENTATION DETERMINATION

CROSS REFERENCE TO RELATED APPLICATIONS

The present application claims priority to Provisional Patent Application Ser. No. 62/769,133, filed Nov. 19, 2018 and entitled METHODS AND APPARATUS FOR ORIENTEERING; and to Non Provisional patent application Ser. No. 16/142,275, filed Sep. 26, 2018 and entitled METHODS AND APPARATUS FOR ORIENTEERING; and to Non Provisional patent application Ser. No. 16/503,878, filed Jul. 5, 2019 and entitled METHOD AND APPARATUS FOR ENHANCED AUTOMATED WIRELESS ORIENTEERING; and to Non Provisional patent application Ser. No. 16/688,775, filed Nov. 19, 2019, entitled METHOD AND APPARATUS FOR WIRELESS DETERMINATION OF POSITION AND ORIENTATION OF A SMART DEVICE and issued on Apr. 21, 2020 as U.S. Pat. No. 10,628,617; and to Non-Provisional patent application Ser. No. 16/721,906, filed Dec. 19, 2019 and entitled METHOD AND APPARATUS FOR DETERMINING A DIRECTION OF INTEREST; and to Non-Provisional patent application Ser. No. 16/775,223, filed Jan. 29, 2020 and entitled SPATIAL SELF-VERIFYING ARRAY OF NODES; and to Non-Provisional patent application Ser. No. 16/817,926, filed Mar. 13, 2020 and entitled APPARATUS FOR OPERATION OF CONNECTED INFRASTRUCTURE; the contents of each of which are relied upon and incorporated herein by reference.

FIELD OF THE INVENTION

The present invention relates to methods and apparatus for enhanced determination of a direction of interest based upon orientation of an apparatus. More specifically, the present invention presents methods and apparatus for indicating a direction based upon wireless communications between transceivers.

BACKGROUND OF THE INVENTION

It is known for a geospatial position to be ascertained based upon triangulation techniques. Such triangulation techniques may be based upon artificial location references, such as satellites and/or cell towers. However, location determination within a structure is limited due to variations in communication signal strength within a structure. In addition, such positioning systems lack an accurate functionality for determining a direction of interest to a user.

SUMMARY OF THE INVENTION

Accordingly, the present invention combines methods and apparatus for enhanced determination of a position of a Smart Device and one or both of a direction of interest of an Agent and a direction of orientation of a Smart Device. The enhanced determination of a position of the Smart Device; and one or both of a direction of interest of an Agent and a direction of orientation of a Smart Device may be accomplished via registration and storage of aspects of an environment surrounding the Smart Device at a first instance in time. The registered aspects are subsequently referenced and compared to registration and storage of similar (or same) aspects at a second instance in time. The comparison of the registered aspects may be combined with wireless communications to provide enhanced location and orientation of the Smart Device. In some embodiments, enhanced location and orientation may be augmented via operation of devices for determining physical attitude of the Smart Device (e.g. pitch and yaw and bank, typically denoted as typically denoted as $\alpha$, $\beta$, $\gamma$, or $\varphi$, $\theta$, $\psi$), wherein a change in pitch, yaw or bank may be tracked from an original position and orientation of the Smart Device to calculate a subsequent position and orientation of the Smart Device Aspects of an environment may include, for example, one or more of physical features in a proximate area to a Smart Device or other Node that are quantifiable via: sonic (including ultrasonic) waves; LIDAR measurements; magnetic force readings and visual light wavelength measurements.

Instruments useful in determining physical features in proximity to a Smart Devices may include, for example, one or more of: accelerometers, charged coupled devices (CCD); LiDAR transmitters and receivers; enhanced magnetic sensors, magneto-resistive sensors, Hall Effect sensors or transducers, MEMS (micro electromechanical sensor) field sensor, anisotropic magneto resistive effect transducers, and giant magneto resistive effect transducers or other mechanism to measure a magnetic field. Location determination may be performed using combinations of positionally fixed Nodes communicating via wireless communication devices and protocols.

The present invention provides for multiple complimentary ways for determining an orientation of a smart device relative to a structure based upon supporting a first transceiver and a second transceiver via an agent at a first geospatial position within radio communication distance to transceivers located within the structure and generating respective logical communications between the first transceiver and each of a first set of three reference point transceivers, the three reference point transceivers fixedly positioned at disparate points in the structure.

A controller may execute software code to determining X, Y and Z coordinates of the first transceiver based upon the respective logical communications between the first transceiver and each of a first set of three reference point transceivers and generate respective logical communications between the second transceiver and each of a second set of three reference point transceivers. The controller may also determine X, Y and Z coordinates of the second transceiver based upon the respective logical communications between the first transceiver and each of a first set of three reference point transceivers.

A magnetic field sensor may generate a first quantification of a magnetic field encompassing the smart device such that a location of the smart device is generated based upon at least one of: X, Y and Z coordinates of the first transceiver, and the X, Y and Z coordinates of the second transceiver. In addition, a first direction of interest may be generated based upon at least two of: the X, Y and Z coordinates of the first transceiver, the X, Y and Z coordinates of the second transceiver, and the quantification of the magnetic field encompassing the smart device.

Data associated with the location of the smart device and the first direction of interest; may be accessed and a user interface may be generated that includes the data associated with the location of the smart device and/or a direction of interest.

In some embodiments, the smart device may be reoriented and a second quantification of the magnetic field encompassing the smart device may be quantified such that a second direction of interest may be generated based upon the second quantification of the magnetic field relative to the smart device.

In some embodiments, the magnetic field sensor may include a Hall Effect sensor and the transceivers may be embodied in one or more of: a smart watch, a smart ring, and a smart wand.

In some embodiments, the smart device may be reoriented and a topographical representation of at least a portion of an environment within an area capable of wireless communication the smart device may be generated, such as, for example using LIDAR or sonic measurements, and generating a second direction of interest based upon the topographical representation.

Apparatus for determining an orientation relative to a structure may include: a controller comprising a processor and a digital storage, said controller in logical communication with a user interface display; a first transceiver supportable by an Agent at a first geospatial position and in logical communication with the controller; and a second transceiver supportable by an Agent at the first geospatial position and in logical communication with the controller; a magnetic field sensor in logical communication with the controller; and executable code stored on the digital storage and executable by the processor to cause the controller to perform the method steps involved in generating a position and direction of interest.

More specifically the controller may be operative to: generate respective logical communications between the first transceiver and each of a first set of three reference point transceivers, the three reference point transceivers fixedly positioned at disparate points in the structure; determine X, Y and Z coordinates of the first transceiver based upon the respective logical communications between the first transceiver and each of a first set of three reference point transceivers; generate respective logical communications between the second transceiver and each of a second set of three reference point transceivers; determine X, Y and Z coordinates of the second transceiver based upon the respective logical communications between the first transceiver and each of a first set of three reference point transceivers; generate a first quantification of a magnetic field encompassing the smart device with a magnetic field sensor; generate a location of the smart device based upon at least one of: X, Y and Z coordinates of the first transceiver, and the X, Y and Z coordinates of the second transceiver; generate a first direction of interest based upon at least two of: the X, Y and Z coordinates of the first transceiver, the X, Y and Z coordinates of the second transceiver, and the quantification of the magnetic field encompassing the smart device; access data associated with the location of the smart device and the first direction of interest; and generate a user interface on the smart device, the user interface comprising the data associated with the location of the smart device.

In addition, in some embodiments, the controller may generate a second quantification of the magnetic field encompassing the smart device following a reorientation of the smart device; and generate a second direction of interest based upon the second quantification of the magnetic field relative to the smart device.

The details of one or more examples of the invention are set forth in the accompanying drawings and the description below. The accompanying drawings that are incorporated in and constitute a part of this specification illustrate several examples of the invention and, together with the description, serve to explain the principles of the invention: other features, objects, and advantages of the invention will be apparent from the description, drawings, and claims herein.

DESCRIPTION OF THE DRAWINGS

The accompanying drawings, that are incorporated in and constitute a part of this specification, illustrate several embodiments of the invention and, together with the description, serve to explain the principles of the invention.

DETAILED DESCRIPTION

The present invention relates to methods and apparatus for enhanced wireless determination of a position and direction of a smart device. Wireless transceivers controlled by the smart device communicate with reference point transceivers to generate data sufficient to determine relative positions of the wireless transceivers and a direction of interest. Operation of one or both of a magnetic force sensor and LIDAR may be operative to verify the position and direction of the Smart Device.

Figure 1:
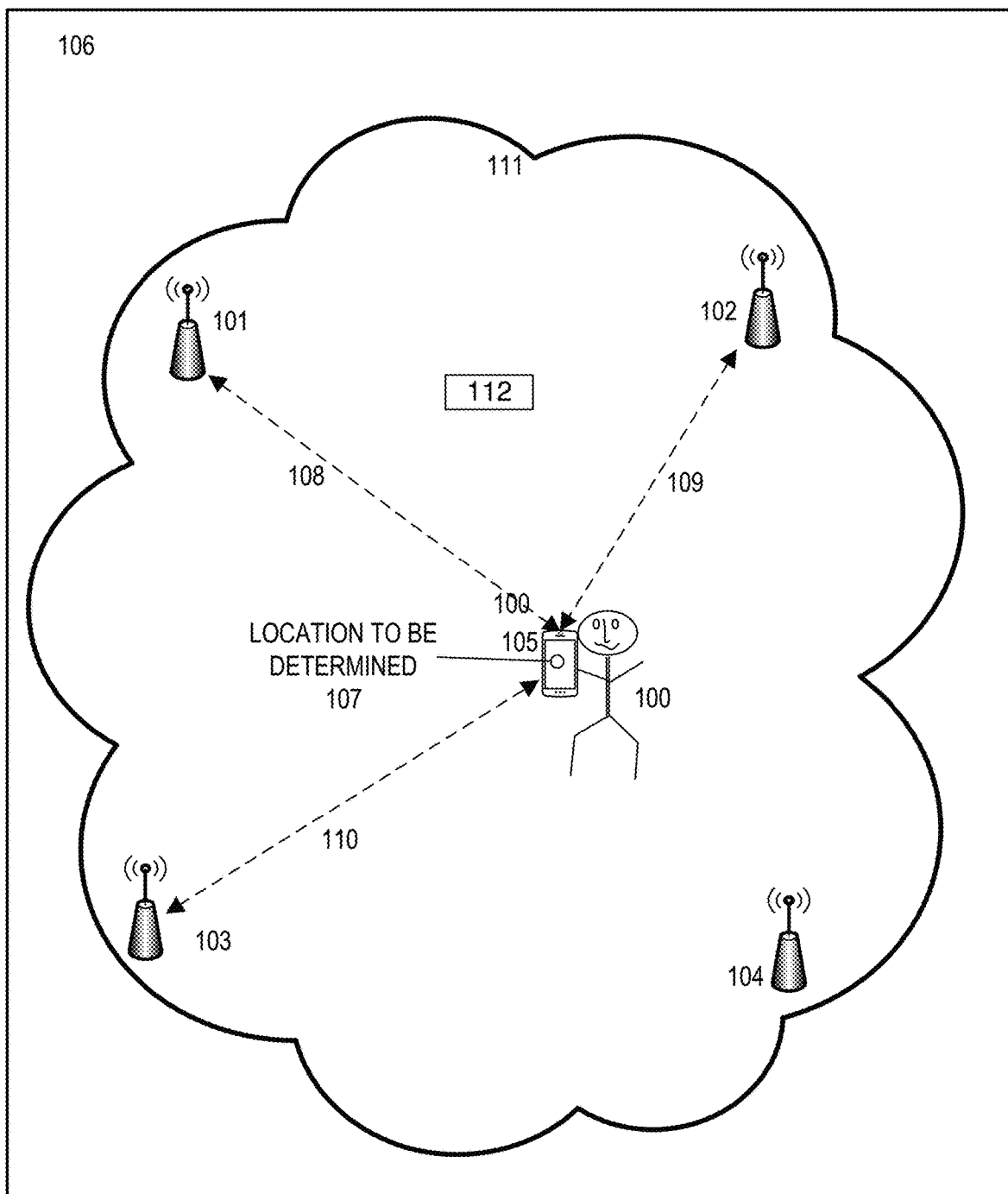
FIG. 1 illustrates location determination with wireless communication to reference point transceivers.

Referring now to FIG. 1, aspects of a system for enhanced wireless position and orientation are illustrated. Reference Point Transceivers 101-104 are shown deployed within or proximate to a Structure 106, to determine a location 107 of a Transceiver 105 supported an Agent 100 within or proximate to the Structure 106. Reference Point Transceivers 101-104 may be fixed in a certain location 112 within or proximate to the Structure 106 and define a wireless communication area 111. The Reference Point Transceivers 101-104 may transceive in a manner suitable for determination of a position of one or more Transceivers 105 supported by an Agent 100, such as, for example, a Transceiver 105 in or associated with a Smart Device, headgear or Tag supported by the Agent 100. Transceiving may be conducted via one or more wireless transmission modalities between a portable Transceiver 105 supported by the Agent 100 and one or more Reference Point Transceivers 101-104.

By way of non-limiting example, Transceivers 105 supported by the Agent 100 may be included in, and/or be in logical communication with, a Smart Device, such as a smart phone, tablet, headgear, ring, watch, wand, pointer, badge, Tag, Node or other Agent supportable device with portable Transceiver 105 able to transceive with the Reference Point Transceivers 101-104.

The Reference Point Transceivers 101-104 may include devices, such as, for example, a radio transmitter, radio receiver, a light generator, a light receiver, a pattern recognizing device. A radio frequency transceiver may transmitters and receivers operative to communicate via wireless modalities such as, for example: WiFi, Bluetooth, Ultrawideband, Ultrasonic, infrared, or other communication modality capable of logical communication between Transceivers 101-105.

In some embodiments, a Reference Point Transceivers 101-104 may include a multi-modality transceiver, that communicates, more locally via a first modality, such as UWB, Bluetooth, WiFi, ANT, Zigbee, BLE, Z Wave, 6LoW-PAN, Thread, WiFi, WiFi-ah, NFC (near field communications), sub Giga Hertz, Dash 7, Wireless HART or similar modality and to a greater distance via a second modality, such as cellular communication modalities (e.g. 3G, 4G 5G and the like), sub GHz, IP Protocol modalities and the like which may provide access to a distributed network, such as the Internet.

Wireless communications between Transceivers 101-105 may engage in logical communications to provide data capable of generating one or more of: Cartesian Coordinates, X, Y, Z coordinates, vector values, AoA, AoD, RTT, RSS, a GPS position, or other data that may be utilized for one or more of: locating one or both of an Agent 100; indicating a direction of interest; and identify a Structure or defined area 106.

A precise location may be determined via triangulation based upon a measured distance from three or more Reference Point Transceivers 101-104. For example, a radio transmission or light signal may be measured and compared from the three reference position identifiers 101-103. Other embodiments may include a device recognizable via image analysis and a camera or other Image Capture Device, such as a CCD device, may capture an image of three or more Reference Point Transceivers 101-104. Image analysis may recognize the identification of each of three or more of the Reference Point Transceivers 101-104 and a size ratio of the respective image captured Reference Point Transceivers 101-104 may be utilized to calculate a precise position. Similarly, a height designation may be made via triangulation using the position identifiers as reference to a known height or a reference height.

Transceivers 101-105 may include circuitry and logic capable of transceiving in a single modality, or multiple disparate modalities. Similarly, a Reference Point Transceiver 101-104 and/or an Agent supported Transceiver 105 may include multiple transceiver device, including, transmitters and receivers.

A modality, as used in conjunction with a Transceiver, transmitter and/or receiver refers to one or both of a bandwidth of wireless communication and a protocol associated with a bandwidth. By way of non-limiting example, a modality, as used in relation to a Transceiver, transmitter and/or receiver may include: WiFi; WiFi RTT; Bluetooth; UWB; Ultrasonic, sonic, infrared; ANT, Zigbee, BLE, Z Wave, 6LoWPAN, Thread, WiFi, Wi-Fi 33-ah, NFC (near field communications), sub Giga Hertz, Dash 7, Wireless HART or other logical communication medium.

Triangulation essentially includes determining an intersection of three distances 108-110, each distance 108-110 calculated from a reference point 101-104 to an Agent supported device 105. The present invention allows for a first distance 108, to be determined based upon a wireless communication in a first modality; and a second distance 109 and a third distance 110 determined based upon a wireless communication in a same or different modality as the first modality. For example, a first distance 108 may be determined based upon a wireless communication using UWB; a second distance 109 may be determined based upon a wireless communication using Bluetooth; and a third communication may be determined based upon a wireless communication using ultrasonic communication (other combinations of same and/or different communication modalities are also within the scope of the present invention).

A location 107 may be determined via triangulation based upon a measured distance from three or more position identifiers 101-103 to the transceiver 105 supported by the Agent 100. For example, timing associated with a radio transmission or light signal may be measured and compared from the three reference position identifiers 101-103. Other embodiments may include a device recognizable via image analysis and a camera or other Image Capture Device, such as a CCD device, may capture an image of three or more position identifiers 101-104.

Additional embodiments, may include image analysis of image data captured via a CCD included in a Smart Device to recognize the identification of each of three or more of the position identifiers 101-104 and a size ratio of the respective image captured position identifiers 101-104 may be utilized to calculate a precise position. Similarly, a height designation may be made via triangulation using the position identifiers as reference to a known height or a reference height. In a similar fashion, triangulation may be utilized to determine a relative elevation of the Smart Device as compared to a reference elevation of the reference points.

In some embodiments, the position 107 of the Agent supported Transceiver 105 may be ascertained via one or more of: triangulation; trilateration; and multilateration (MLT) techniques.

In some embodiments, a geospatial location based upon triangulation may be generated based upon a controller receiving a measurement of angles between the position and known points at either end of a fixed baseline. By way of non-limiting example, a point of a geospatial location may be determined based upon generation of a triangle with one known side and two known angles. Moreover, a geospatial location based upon multilateration may be generated based on a controller receiving measurement of a difference in distance to two reference positions, each reference position being associated with a known location. Wireless signals may be available at one or more of: periodically, within determined timespans and continually. The determination of the difference in distance between two reference positions provides multiple potential locations at the determined distance. A controller may be used to generate a plot of potential locations. In some embodiments, the potential determinations generally form a curve. Specific embodiments will generate a hyperbolic curve.

The controller may be programmed to execute code to locate a relatively exact position along a generated curve, which is used to generate a geospatial location. The multilateration system thereby receives as input multiple measurements of distance to reference points, wherein a second measurement taken to a second set of stations (which may include one station of a first set of stations) is used to generate a second curve. A point of intersection of the first curve and the second curve may be used to indicate a specific location.

In another aspect, in some embodiments, the location of a Transceiver 101-105 may be determined and/or aided via discernment of data based upon a physical artifact, such as, for example a visually discernable feature, shape or printed aspect located within the Structure 106. Discernment of the physical artifact may, for example, be based upon topographical renditions of physical aspects included in the Structure, such as those measured using LIDAR, a magnetic force, image data (or a point cloud derived from image data). A pattern on a surface may convey a reference point by a recognizable pattern (which may be unique to the setting), Vernier or three dimensional structure as non limiting examples. A Smart Device ascertaining a physical reference mark and a distance of the Smart Device to the mark may determine a relative location in space to a coordinate system of the marks.

Marks tied to a geospatial coordinate system may be utilized to determine a relative location. A number of methods may be executed to determine a distance from the Smart Device to a mark such as, for example, a sense reflection of light beams (preferably laser beams), electromagnetic beams of wavelength outside of the visible band such as IR, UV, Radio and the like, or sound based emanations.

In some examples, a carefully placed reference point Node may function as a transceiver of signals. For example, a Node may receive and transmit signals in a radio frequency band of the electromagnetic spectrum. In a simple form, a Node may detect an incoming signal and coincidently broadcast a radio frequency wireless communication. Frequencies utilized for wireless communication may include those within the electromagnetic spectrum radio frequencies used in UWB, WiFi, and Bluetooth modalities, as well as IR, Visible and UV light as examples.

In some embodiments, sound emanations may also be used as a communication mechanism between a smart device and a Reference Point Transceiver 101-104. In some examples, the Reference Point Transceiver 101-104 may function to communicate data with their electromagnetic or sonic transmissions. Such communications may provide identifying information unique to the Node, data related to the synchronization of timing at different well located reference points, and may also function as general data communication nodes. A triangulation calculation of the position of a Smart Device or a Node may result from a system of multiple reference position Nodes communicating timing signals to or from the Smart Device or Node. Methods of calculating positions via wireless communications may include one or more of: RTT, RSSI, AoD, AoA, timing signal differential and the like, Triangulation or other mathematical techniques may also be employed in determining a location.

The process of determination of a position based upon triangulation with the reference points may be accomplished, for example via executable software interacting with the controller in a Smart Device, such as, for example via running an app on the Smart Device.

Reference points may be coded via identifiers, such as a UUID (Universally Unique Identifier), or other identification vehicle.

Reference Position Transceivers 101-104 may be deployed in a defined area 106 to determine a location 107 of an Agent 100 within or proximate to the defined wireless communication area 111. Reference Position Transceivers 101-104 may be fixed in a certain location and transceive in a manner suitable for a triangulation determination of the position of the Agent. Transceiving may occur via wireless transmission to one or more Transceivers 105 supported by the Agent 100. By way of non-limiting example, Transceivers 105 supported by the Agent 100 may be included in, or be in logical communication with, a Smart Device with Transceivers 105 able to transceive with the Reference Position Transceivers 101-104.

The Reference Position Transceivers 101-104 may include devices such as a radio transmitter, radio receiver, a light generator, or an image-recognizable device (i.e., an apparatus set out in a distinctive pattern recognizable by a camera). A radio transmitter may include a UWB Node, Wi-Fi, Bluetooth or other communication device for entering into logical communication between Transceivers 101-105. In some embodiments, Reference Position Transceivers 101-104 may include a Wi-Fi router that additionally provides access to a distributed network, such as the Internet. Cartesian coordinates (including Cartesian coordinates generated relative to a GPS or other reference point), or any other coordinate system, may be used as data that may be utilized for one or more of: locating one or both of an Agent 100; indicating a direction of interest; and identifying a Structure 106 or defined area 106. A radio transmitter may include a router or other Wi-Fi device. The radio transmitter may include transmissions via a Ultra Wideband ("UWB") frequencies including, for example, 3.5-6.5 GHz; on Wi-Fi frequencies (300 MHz-60 GHz), sub GHz frequencies or other modality. A light generator may distribute light at human-safe intensities and at virtually any frequency known in the art. Such frequencies include, without limitation, infrared, ultraviolet, visible, or nonvisible light. Further, the light beacon may comprise a laser, which may transmit light at any of the aforementioned frequencies in a coherent beam.

This plurality of modalities allows for increased accuracy because each modality may have a different degree of reliability. For example, a Smart Device 101 ND/OR smart receptacle may measure A timing signal transmitted by a Reference Point Transceiver 101-104 within a different error tolerance than it may measure the receipt into a photodetector of infrared laser light. This has at least two principle benefits. First, a location calculation may, in some embodiments, be a weighted average of the location calculated from each modality. Second, outliers may be shed. For example, if the standard location calculation comprises a weighted average of the location as calculated by five modalities, but one modality yields a location greater than two standard deviations from the average computed location, then that modality may not be considered for future weighted location calculations.

Additionally, the radio transmitters and/or transceiver in the Smart Device may comprise multiple antennas that transmit signals in a staggered fashion to reduce noise. By way of non-limiting example, if there are three antennas, then they may transmit a signal in intervals of 20 milliseconds. Given this rate of transmission, a detected time of arrival may be used to determine the distance between the transmitter and the antenna (i.e., the Smart Device). Moreover, the antennas may comprise varying lengths to accommodate desirable wavelengths. Further, dead reckoning may be used to measure location, using traditional methods of numerical integration.

A precise location may be determined based upon wireless transmissions between Nodes, such as between an Smart Device and the Reference Position Transceivers. Timing determinations—as well as signal qualities like angle of arrival, angle of departure, transmission strength, transmission noise, and transmission interruptions—may be considered in generating relative positions of Nodes. Additional considerations may include AI and unstructured queries of transmissions between Nodes and triangulation logic based upon a measured distance from three or more Reference Position Transceivers 101-104. For example, a radio transmission or light emission may be measured, and timing associated with the radio transmission or light to determine a distance between Nodes. Distances from three Reference Position Transceivers AA01-AA03 may be used to generate a position of a Node in consideration. Other methodologies include determination of a distance from one or more Nodes and a respective angle of arrival and/or angle of departure of a radio or light transmission between the Node in consideration and another Node (Reference Point Node or dynamic position Node).

In some embodiments of the invention, position determination in a Structure or on a Property contemplates determination of a geospatial location using triangulation, trilateration, or multilateration techniques. In some embodiments, a geospatial location relative to one or more known reference points is generated. The geospatial location in space may be referred to as having an X,Y position indicating a planar designation (e.g. a position on a flat floor), and a Z position (e.g. a level within a Structure, such as a second floor) may be generated based upon indicators of distance from reference points. Indicators of distance may include a comparison of timing signals received from wireless references. A geospatial location may be generated relative to the reference points. In some embodiments, a geospatial location with reference to a larger geographic area is associated with the reference points, however, in many embodiments, a controller will generate a geospatial location relative to the reference point(s) and it is not relevant where the position is located in relation to a greater geospatial area. In addition to these Cartesian coordinates, polar coordinates may be used, as further described below.

A geospatial location based upon triangulation may be generated based upon a controller receiving a measurement of angles between the position and known points at either end of a fixed baseline. A point of a geospatial location may be determined based upon generation of a triangle with one known side and two known angles.

Referring again to FIG. 1, triangulation essentially includes determining an intersection of three distances 108-210, each distance 108-110 calculated from a reference point 101-104 to an Agent-supported device 105. The present invention allows for a first distance 108 to be determined based upon a wireless communication in a first modality; and a second distance 109 and a third distance 110 determined based upon a wireless communication in a same or different modality as the first modality. For example, a first distance 108 may be determined based upon a wireless communication using UWB; a second distance 109 may be determined based upon a wireless communication using Bluetooth; and a third communication may be determined based upon a wireless communication using ultrasonic communication (other combinations of same and/or different communication modalities are also within the scope of the present invention).

A geospatial location based upon trilateration may be generated based upon a controller receiving wireless indicators of distance and geometry of geometric shapes, such as circles, spheres, triangles and the like.

A geospatial location based upon multilateration may be generated based on a controller receiving a measurement of a difference in distance to two reference positions, each reference position being associated with a known location. Wireless signals may be available at one or more of: periodically, within determined timespans, and continually. The determination of the difference in distance between two reference positions provides multiple potential locations at the determined distance. A controller (such as one in the Smart Device) may be used to generate a plot of potential locations. In some embodiments, the potential determinations generally form a curve. Specific embodiments will generate a hyperbolic curve.

The controller may be programmed to execute code to locate an exact position along a generated curve, which is used to generate a geospatial location. The multilateration thereby receives as input multiple measurements of distance to reference points, wherein a second measurement taken to a second set of stations (which may include one station of a first set of stations) is used to generate a second curve. A point of intersection of the first curve and the second curve is used to indicate a specific location.

In exemplary embodiments, as described herein, the distances may be triangulated based on measurements of UWB, Wi-Fi or sub GHz strength at two points. Transceiver signals propagate outward as a wave, ideally according to an inverse square law. Ultimately, a crucial feature of the present invention relies on measuring relative distances between two points. In light of the speed of Wi-Fi waves and the real-time computations involved in orienteering; these computations need to be as computationally simple as possible. Thus, depending upon a specific application and mechanism for quantifying a condition or location, such as a measurement, various coordinate systems may be desirable. In particular, if the Smart Device moves only in a planar direction while the elevation is constant, or only at an angle relative to the ground, the computation less complicated.

One exemplary coordinate system includes a polar coordinate system. One example of a three-dimensional polar coordinate system is a spherical coordinate system. A spherical coordinate system typically comprises three coordinates: a radial coordinate, a polar angle, and an azimuthal angle (r, θ, and φ, respectively, though θ and φ are occasionally swapped conventionally).

By way of non-limiting example, suppose Point 1 is considered the origin for a spherical coordinate system (i.e., the point (0, 0, 0)). Each Transceiver 101-105 emitter $e_1$, $e_2$, $e_3$ can be described as points $(r_1, \theta_1, \varphi_1)$, $(r_2, \theta_2, \varphi_2)$, and $(r_3, \theta_3, \varphi_3)$, respectively. Each of the $r_i$'s ($1 \leq i \leq 3$) represent the distance between the Transceiver 101-105 emitter and the Transceiver 101-105 receiver on the Smart Device 101 or Smart Receptacle (see FIG. 5A).

It is understood that in some embodiments, an azimuth may include an angle, such as a horizontal angle determined in an arcuate manner from a reference plane or other base direction line, such as an angle formed between a reference point or reference direction; and line (ray or vector) such as a ray or vector generated from or continuing to a Smart Device. In preferred embodiments, the ray or vector may be generally directed from a Reference Position Transceiver towards, and/or intersect one or more of: an item of interest; a point of interest; an architectural aspect (such as a wall, beam, header, corner, arch, doorway, window, etc.); an installed component that may act as a reference in an augmented virtual model (AVM) (such as, for example, an electrical outlet, a light fixture, a plumbing fixture, an architectural aspect; an item of equipment; an appliance; a multimedia device, etc.); another Reference Position Transceiver or other identifiable destination.

Accordingly, in some embodiments, a spherical coordinate system may include Reference Position Transceiver that is capable of determining an angle of departure of a location signal and a Transceiver that is capable of determining an angle of arrival of the location signal; one or both of which may be used to facilitate determination of an applicable azimuth.

According to various embodiments of the present invention, one or both of an angle of departure and an angle of arrival may therefore be registered by a Transceiver that is transmitting and/or receiving wireless signals (e.g. radio frequency, UWB, Bluetooth 5.1, sonic frequency, or light frequency).

In some embodiments, locating an Agent occurs in or proximate to a Structure in which Reference Position Transceivers, (including, for example, one or more of: Wi-Fi Transceivers, UWB Transceivers, Bluetooth Transceivers, infrared Transceivers and ultrasonic Transceivers) may be located above and/or below an Agent. In these embodiments, a cylindrical coordinate system may be more appropriate. A cylindrical coordinate system typically comprises three coordinates: a radial coordinate, an angular coordinate, and an elevation (r, θ, and z, respectively). A cylindrical coordinate system may be desirable where, for example, all Wi-Fi emitters have the same elevation. Angles may be determined as described above.

In some embodiments, transceivers 101-105 including arrays of antennas may be used to measure an angle of radio communication (e.g. angle of arrival and/or angle of departure). Various configurations of transmitting antennas and receiving antennas may be used. For example, a radio transmission may be transmitted with a single antenna and received with a receiver with an array of antennas, the phase or timing difference of arriving signals can be used to calculate the angle at which the signals emerged. In angle of departure schemes, a transmitter may contain an array of antennas and may send a pattern of signals through the array that arrive at a receiver with a single antenna where the angle of departure (AoD) is communicated.

Measurement of angle of arrival may be performed as mentioned by calculation of time difference of arrival at the antennas in an array or alternatively can be performed by rotation of antenna elements.

Some modalities, such as those modalities that adhere to the Bluetooth 5.1 or BL5.1 standards, allow a Smart Device 101, Smart Receptacle or other Node to determine an angle of arrival (AoA) or an angle of departure (AoD) for a wireless transmission. An array of antennas may be used to measure aspects of the Bluetooth signaling that may be useful to calculate these AoA and AoD parameters. By calibrating an antenna system, the system may be used to determine angles in one or two dimensions depending on the design of the antenna. The result may be significant improvement in pinpointing the location of origin of a signal.

An array of antennas may be positioned relative to each other and a transmitting transceiver to allow for extraction of an AoA/AoD. Such an array may include a rectangular array; a polar or circular array; a linear array; and a patterned array, where a number of antennas are deployed in a pattern conducive to a particular environment for transceiving. Antennas may be separated by characterized distances from each other, and in some examples, a training protocol for the antenna array results in antenna positioning incorporating superior angle and location precision. Some transceivers may transceive in 2.4-2.482 GHz frequency bands, and thus the radiofrequency transmissions may have wavelengths in the roughly 125 mm length scale. A collection of antennas separated by significantly less than the wavelength may function by comparing a phase of RF transmissions arriving at the antennas. An accurate extraction of phase differences can yield a difference in path length that when accumulated can lead to a solution for the angles involved. In some embodiments, Transceivers 101-105 may include antenna arrays combined with batteries and circuitry to form complete self-contained devices. Antenna arrays and methods of using the same for determining position and direction of a Smart Device or other Node are described in U.S. Ser. No. 16/775,223, the contents of which are incorporated herein by reference.

In an example, an Agent supported transceiver 105 may be located at a position and may transmit a signal of the various types as have been described. Nodes, such as reference point transceivers 101-104 located at reference points in the wireless communication area around the position of the Agent 100 may receive the transmission and determine the angle of arrival of that transmission. Similarly, transmission associated with other transceivers 101-103 may also determine an angle of arrival of transmissions. In some embodiments, transceiver 101-103 may communicate with one or more of: each other, a smart device, a controller or other processor to mathematically process multiple angles and locations of the transceivers and calculate a position of a transmission emanation. In examples where calculations are not performed at a smart device, a communication to the smart device of the calculated position may be communicated.

In certain embodiments of the invention, a direction of interest indicated by Smart Device 101 or a Smart Receptacle (see FIG. 5A) may be determined based upon a movement of Smart Device 101 or a Smart Receptacle 502. For example, a device with a controller and an accelerometer, such as mobile Smart Device, may include a user display that allows a direction to be indicated by movement of the device from a determined location acting as a base position towards an As Built feature in an extended position. In some implementations, the Smart Device may first determine a first position based upon triangulation with the reference points and a second position (extended position) also based upon triangulation with the reference points. These position determinations may proceed as described above. The process of determination of a position based upon triangulation with the reference points may be accomplished, for example via executable software interacting with the controller in the Smart Device, such as, for example via running an app on the Smart Device. Logical communications relevant to location determination may include, for example, one or more of: timing signals; SIM information; received signal strength; GPS data; raw radio measurements; Cell-ID; round trip time of a signal; phase; and angle of received/transmitted signal; time of arrival of a signal; a time difference of arrival; and other data useful in determining a location.

In another aspect, captured data may be compared to a library of stored data using image recognition software to ascertain and/or affirm a specific location, elevation and direction of an image capture location and proper alignment with the virtual model. In an example, a position of a user may be determined by any of the means described herein. A user may position a camera of an associated smart device to be pointing in a direction of interest and obtain an image. The image may be passed on to a server with access to database of images containing stored images of the space around the user. Algorithms on the server may compare the stored images to the image captured by the user, and may calculate adjustments to the comparative image based on where the reference image was taken in relationship to the location of the user. Based on the determination that the calculated adjusted image compared to the image obtained by the user in the direction of interest, a direction may be inferred with known location of objects in the reference image. In some variations, the differences in features of the user obtained image compared to a reference image may be used to calculate a direction of interest based upon a location at which the reference image was obtained.

In some examples, stored images may be obtained at multiple angles to improve accuracy of orienteering. These examples may include sensor arrays, audio capture arrays and camera arrays with multiple data collection angles. In some examples a full 360 degree camera perspective may be obtained by such arrays. In some directional arrays, a sensor array (including image capture sensors) may include at least 120 degrees of data capture. By collecting such image collections as the sensor/camera systems are moved a database of image perspectives may be formed and utilized to assist in orienteering as described.

Non-limiting examples may include image based identification where a device with some imaging means, including but not limited to a mobile device camera, tablet device camera, computer camera, security camera, or AR headset camera may image points of interest in a direction of interest. These points of interest may be identified. Image recognition software may be used to identify the visualized landscape by its identifying features. Machine learning may be used to train systems using this software to identify specific features of the environment in question.

To create a supplemental topographic part of a model of the environment of a user, laser scanning and/or LiDAR may be performed during the acquisition of imagery for a reference database. A resulting three dimensional shape model may be modelled with the captured imagery to help in the comparison to user data. Three dimensional shape can be used to infer comparative imagery at different angles of acquisition than exist in a database. In another example, a device of a user may have the means of performing laser scanning or LiDAR scanning of the environment as well as obtaining images. The resultant three dimensional data or a composite of the three dimensional data and the imagery may be used to recognize features and determine a direction that the user was facing when they collected the image.

The results of scanning may be stored and presented in different manners. In some examples, the scanned data may be represented by a point cloud representation, in other examples an estimated topographic surface representation may be used to visualize the three dimensional shape data obtained. In some examples, outward facing planes of the surface topography may have the captured imagery superimposed upon them. The resulting image and three dimensional models may be used to calculate a direction of interest or a device field of view in a dynamic sense or alternatively upon user request.

In some examples other methods of capturing spatially accurate information may include the use of drones and optical scanning techniques which may include high resolution imagery obtained from multiple viewpoints. Scanning may be performed with light based methods such as a CCD camera. Other methods may include infrared, ultraviolet, acoustic, and magnetic and electric field mapping techniques.

In other embodiments, a single distance to a point of interest in an image, which may be obtained by a laser, other collimated light source, sound source or the like, may be used with models of the environment of the user. A comparison of the imagery and the measurement of the distance of the user to a prominent feature in the image may allow for an orientation of the user to be determined algorithmically.

Figure 2:
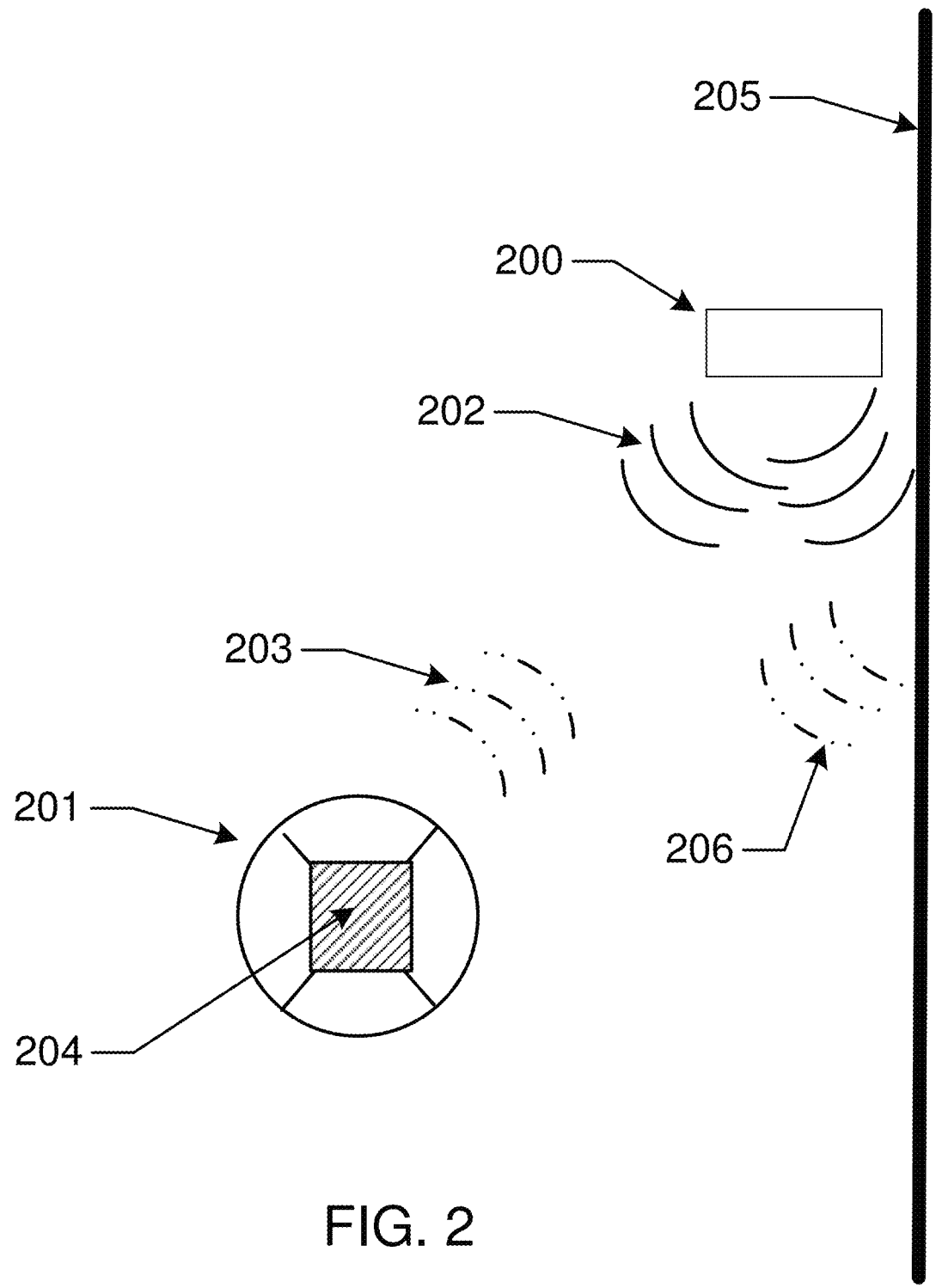
FIG. 2 illustrates location determination using sonic transceivers.

Referring now to FIG. 2, in some exemplary embodiments, radio frequencies used for wireless communication include sound waves used to perform one or more of: location determination; movement tracking in interior or exterior areas; and distance calculation. Sound wave transmissions include a number of significant attributes, which may translate into a benefit for a given set of circumstances when used for RF based location determination.

According to the present invention, sonic waves may be deployed independently, or in combination with electromagnetic transmissions and reception of logical communications utilizing other bandwidths, such as bandwidths associated with Ultrawideband, WiFi, Bluetooth, Ultrawideband, ANT, infrared or almost any wavelength in the Industrial, Scientific and Medical bands (sometimes referred to as "ISM Bands").

For example, sound waves travel through an ambient atmosphere at a significantly slower speed than electromagnetic radiation ($6\times10^2$ m/sec versus $3\times10^8$ m/sec). Therefore, a relative accuracy for measurements related to travel times may be improved in some environments by orders of magnitude using sonic based location tracking as compared to electromagnetic based measurements. Therefore, using sonic communications may result in increased accuracy of location determination, in some environments.

The present invention also provides for sonic wave emanations may be used to compliment electromagnetic emanations based upon a tendency that sonic waves generally do not efficiently penetrate walls other physical items or structures. Sonic transceivers may be particularly advantageous in a defined area where location can be unambiguously determined to be within a particular room (the use of multiple bandwidth transmitting and receiving for different purposes is further discussed below). Sound wave interaction with a solid surface, such as a wall, may require that for optimal performance, transceiver/transmitters/receivers to be located in each room where location detection is desired. In some embodiments, a reflected sonic transmission may be received and analyzed to determine an effect of the reflected nature of the transmission.

Accordingly, methods may be employed using sonic emanations and reception for location determination. In general, frequencies of effective indoor sonic location detection may be at ultrasonic bandwidths (commonly used bandwidths include frequencies of between 1 MHz and 10 MHz, although frequencies of less than 50 kHz to greater than 200 MHz are possible). The utilized frequencies may be either below or above audible detection by people or other animals in the location; such as at frequencies above 20 kHz.

Sound waves may be used to perform one or more of: location determination, movement tracking in interior or exterior locations, and distance calculation from a position to a Smart Device 101, which may be accomplished based upon transmission and receipt of sonic transmission. Sound wave transmissions include several significant attributes, which may be beneficial for a given set of circumstances when used for radiofrequency-based location determination. According to the present invention, sonic waves may be deployed independently, or in combination with, transmissions and reception of logical communications utilizing other bandwidths, such as bandwidths associated with Wi-Fi, Bluetooth, ANT, infrared or almost any wavelength in the Industrial, Scientific and Medical bands (sometimes referred to as "ISM Bands"). Methods, devices, and apparatus for using sound waves in location determination may be found, for example, in U.S. Pat. No. 10,628,617, the contents of which are incorporated herein.

As illustrated in FIG. 2, in some embodiments, a sonic Transceiver 200 may transmit a sonic transmission 202 and determine a location 201 based upon receiving an echo 203 back from an Agent supported transceiver 204. Walls 205 may also generate reflected sonic emanations 206.

In some examples, as may be used in orienteering herein, an Agent supported device 204 may support receivers, transmitters or transceivers that interact with ultrasonic transceivers fixedly secured to a reference point position, such as via mechanical mounting within a room environment. An ultrasonic positioning system may have indoor positioning accuracy at centimeter, millimeter, and even sub millimeter accuracy. Multiple ultrasonic Transceivers may transceive from an Agent supported device to communicate with fixed reference point transceivers may transmit signals. Arrival of the sound transmissions may be accurately timed and converted to distances. In some embodiments, distance determinations may be improved with knowledge of temperatures in the environment containing the sound transceiving. For example, temperature may be measured at one or more of: an Agent supported smart device, a Reference Point position, and an ambient environment.

In some examples, synced timing apparatus is able to generate a location of a stationary Agent to within centimeter accuracy using sonic wave transmissions and reception and preferably within several millimeters of accuracy. In addition, in some embodiments sensors are able to detect frequency shifts within the sonic emanations which may add information about the relative rate of movement of the Agent, which may then in turn allow for correction to the timing signals.

In some examples, a combination of radio frequency emissions and ultrasonic emissions may be used. For example, a compliment of radio frequency emissions/receptions and ultrasonic of radio frequency emissions and ultrasonic emissions may be reconciled to generate more accurate location determination. In another aspect, a radio frequency signal may be used to transmit syncing signals that establish a time that ultrasonic signals are transmitted. Since, the electromagnetic transmissions may be orders of magnitude faster than sound transmissions, the electromagnetic transmissions relatively small time of travel from the Transceivers to the Agent may be negligible and therefore used as "zero-time" setpoints as received at the Agent supported Transceiver. In such embodiments, a controller determining a location may use not only relative arrival times, but also a delta time between a radiofrequency transmission and ultrasonic transmission to determine a distance from a transmitting Transceiver. An array of such ultrasonic and/or radiofrequency transceivers provide increased accuracy in triangulating a location of the Agent.

In still further examples, RF communications may not only transmit a syncing pulse, but also transmit digital data about various aspects of a defined area, such as the defined area's identification, its relative and/or absolute location in space and other refinements. In some examples, data related to improved distance calculation may also be transmitted by RF communication such as temperature of the environment, humidity and the like which may influence the speed of sound in the environment as a non-limiting example. In some examples such a system may result in millimeter level accuracy of position determination.

In some examples, the process may be iterated to refine the direction of each of the ultrasonic transmitters and maximize signal levels of the transmission which may provide additional information in the calculation of a position. RF and WiFi transmissions may be used for data communications and syncing as have been described. In other examples, as an Agent supported device 204 is moving, an iterative process may be used to track the Agent supported device 204 moves through space. Stationary Agents may be tracked with submillimeter accuracy in some embodiments.

Figure 3:
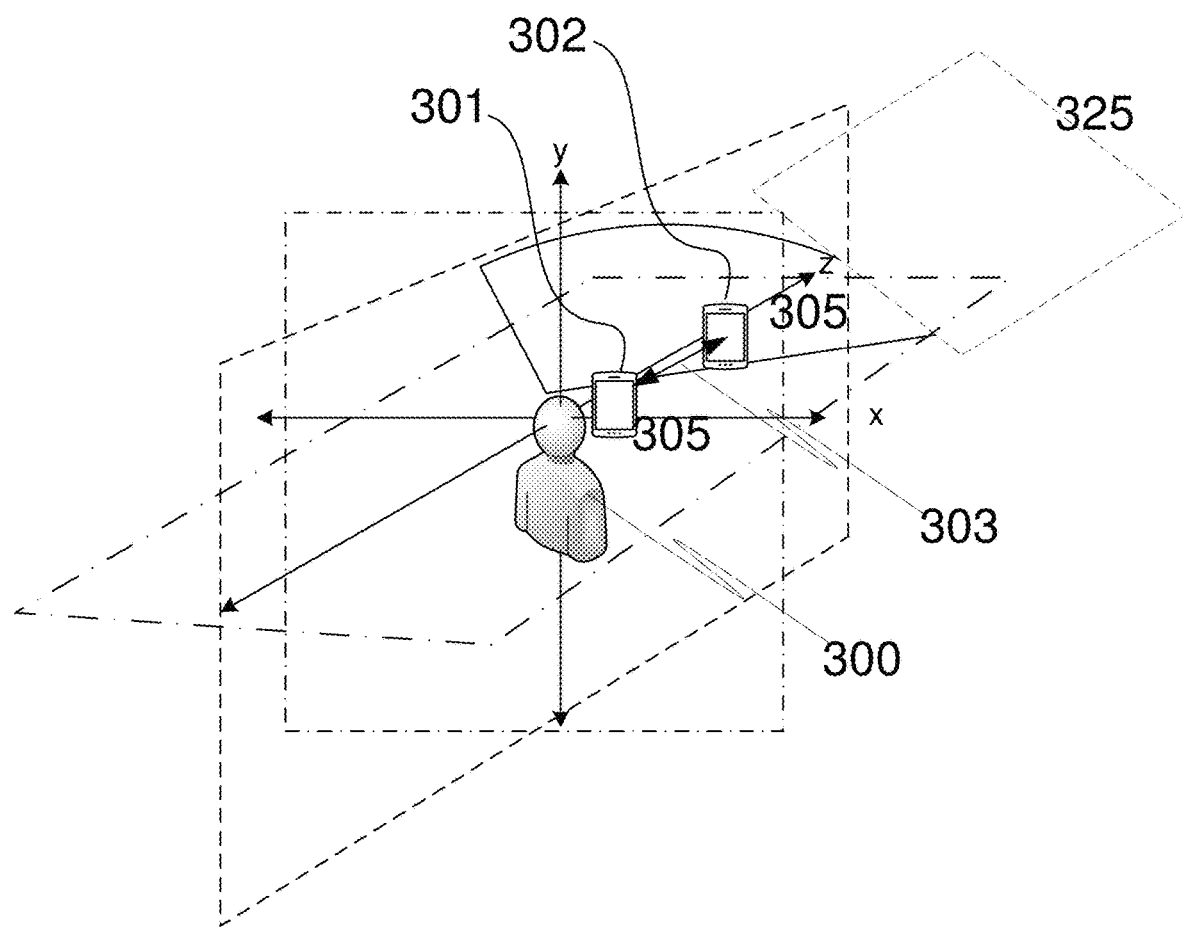
FIG. 3 illustrates methods of orienteering by device movement.

Referring now to FIG. 3, methods and devices for determining a direction that may be referenced for one or both of data capture and data presentation of a particular portion of the virtual representation of surroundings of a user. A User 300 may position a Transceiver 305 in a first position 301 proximate to a portion in a space of interest 325. The first position 301 of the Transceiver 305 may be determined and recorded. The User 300 may then relocate the Transceiver 305 to a second position 302 in a general direction of the portion in space of interest. With associated position information obtained for the first and second positions a controller in an external system or in an associated Transceiver 305 may generate one or both of a ray and a vector towards the portion of a space of interest.

In some embodiments, the vector may have a length determined by a controller that is based upon a distance to a feature of interest in space as represented in a model on the controller in the direction of the generated vector. The vector may represent a distance 303 from the second position 302 to the space of interest 325 along the axis defined by a line between the first position 301 and the second position 302. In contrast, a ray may include just a starting point and a direction.

In still other embodiments, a device with a controller and an accelerometer, such as mobile phone, tablet or other Smart Device that includes a Transceiver 305, may include a user display that allows a direction to be indicated by movement of the device from a determined location acting as a base position towards an point in a direction of interest or representing a center of a field of view of the device. The movement may occur to a second location in an extended position. In some implementations, the Smart Device determines a first position 301 based upon triangulation with the reference points. The process of determination of a position based upon triangulation with the reference points may be accomplished, for example via executable software interacting with a controller in the Smart Device, such as, for example by running an app on the Transceiver 305.

Figure 4A:
FIGS. 4A-4D illustrate exemplary configurations of antenna arrays.
Figure 4B:
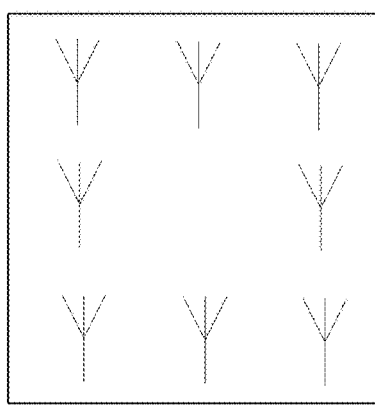
Figure 4C:
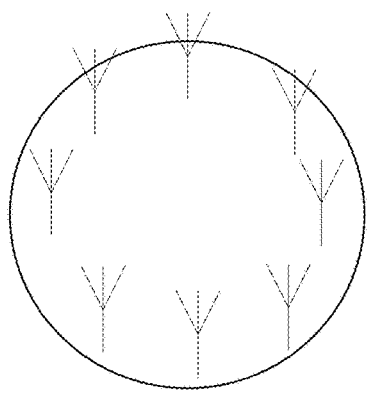

Referring to FIGS. 4A-D a series of exemplary devices employing matrices (or arrays) of antennas for use with Nodes that communicate wirelessly, such as, via exemplary UWB, Sonic, Bluetooth, a Wi-Fi or other modality, is illustrated. Linear antenna arrays 401 are illustrated in FIG. 4A. Rectangular antenna arrays 402 are illustrated in FIG. 4B. Circular antenna arrays 403 are illustrated in FIG. 4C, other shapes for arrays are within the scope of the invention. In addition, an antenna array may be omni-directional or directional.

Figure 4D:
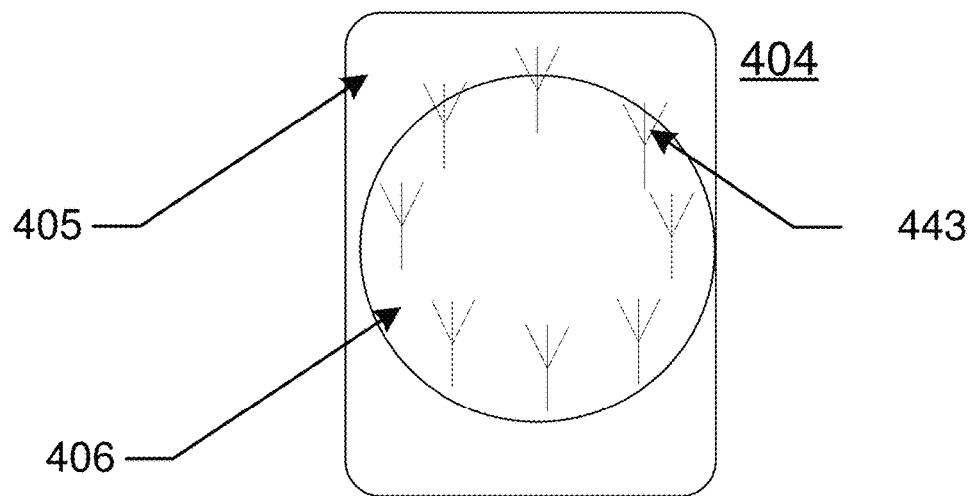

In some embodiments, as illustrated in FIG. 4D a Smart Device 405 may include one or more Nodes 406 internal to the Smart Device 405 or fixedly attached or removably attached to the Smart Device 405. Each Node 406 may include antenna arrays combined with a power source and circuitry to form complete self-contained devices. The Nodes 406 or a controller may determine an RTT, time of arrival, AoA and/or AoD or other related angular determinations based upon values for variables involved in wireless communications. For example, a composite device 404 may be formed when a Node 406 with a configuration of antennas, such as the illustrated exemplary circular configuration of antennas 443, is attached to a Smart Device 405. The Node 406 attached to the Smart Device 405 may communicate information from and to the Smart Device 405 including calculated results received from or about another Node 406, such as a Node 406 fixed as a Reference Point Transceiver or a Node with dynamic locations, wherein the wireless communications are conducive to generation of data useful for determination of a position (e.g. timing data, angles of departure and/or arrival, amplitude, strength, phase change, etc.). A combination of angles from multiple fixed reference points to the antenna array can allow for a location of a user in space. However, with even a single wireless source able to communicate with the antenna array, it may be possible to determine a direction of interest or a device related field of view.

An array of antennas positioned at a reference point may allow for the accurate receipt of orientation information from a transmitter. As discussed earlier a combination devices with arrays of antennas may be used to calculation a position. A single Node with an array of antennas can be used for orienteering and determining a direction of interest. Each of the antennas in such an array receiving a signal from a source will have different phase aspects of the received signal at the antennas due to different distances that the emitted signal passes through. The phase differences can be turned into a computed angle that the source makes with the antenna array.

Figure 5A:
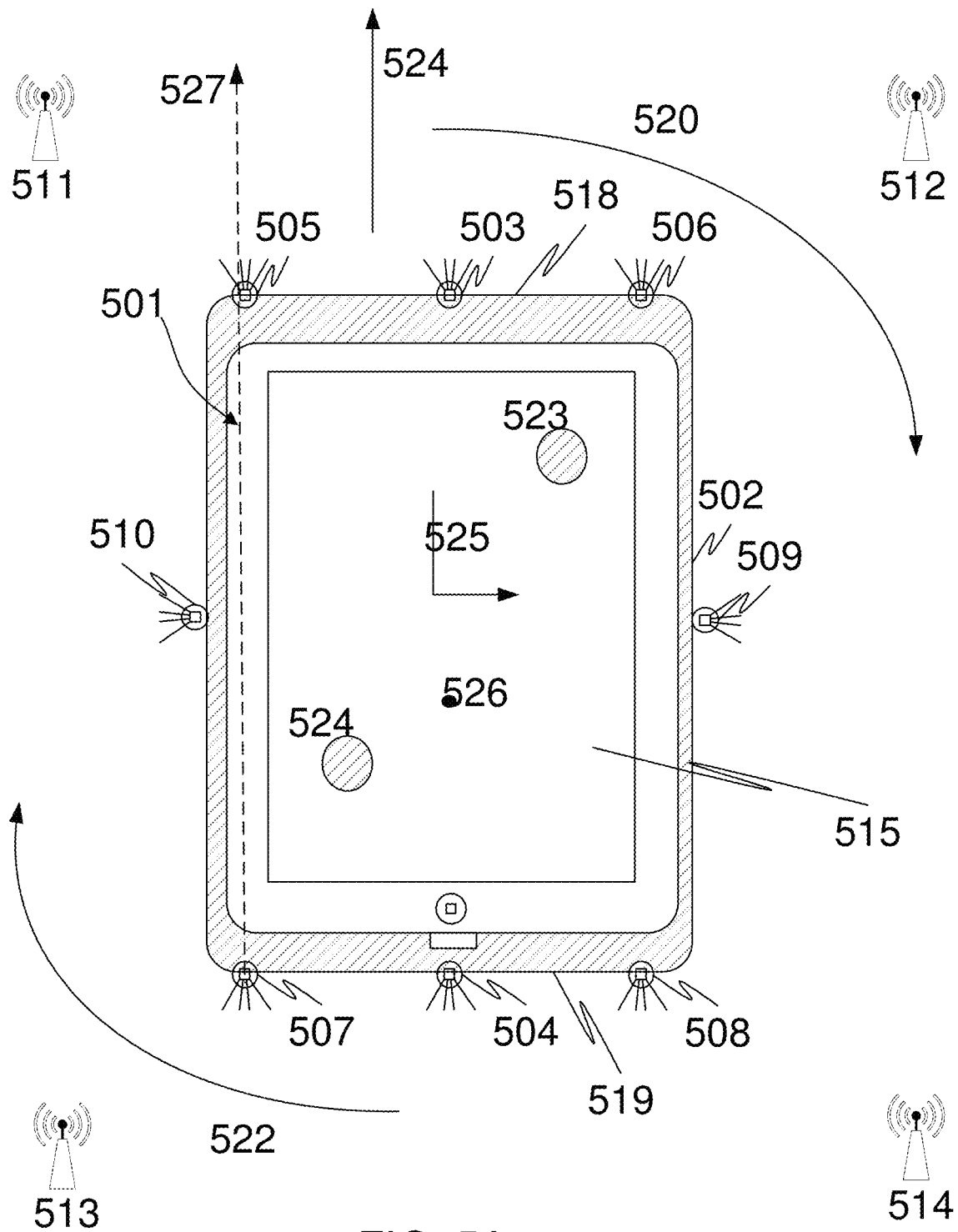
FIG. 5A illustrates an exemplary smart device with an array of antennas.

Referring now to FIG. 5A, in some embodiments, one or both of a Smart Device 501 and a Smart Receptacle 502 may incorporate multiple Transceivers 503-510 and a direction of interest may be ascertained by generating a vector 527 passing through a respective position of each of at least two of the transceivers (as illustrated through transceiver 505 and 507). The respective positions of each of the transceivers 503-510 supported by the Smart Device 501 and/or Smart Receptacle 502 may be ascertained according to the methods presented herein, including for example via triangulation, trilateration, signal strength analysis, RTT, AoD, AoA, topography recognition. Reference point transceivers 511-514 are located in known, fixed position.

In some embodiments, one or both of the Smart Device 501 and the Smart Receptacle 502 incorporating Transceivers 503-510 may be rotated in a manner (such as, for example in a clockwise or counterclockwise movement 520 522 relative to a display screen) that repositions one or more Transceivers 503-510 from a first position to a second position. A vector 526 may be generated at an angle that is zero degrees 524 with a plane of a display 515 or perpendicular 525 or some other designated angle in relation to the smart device 501 and an associated display screen 515. In some embodiments, an angle in relation to the smart device is perpendicular 525 to a display screen 515 and thereby viewable via a forward looking camera (or other CCD or LIDAR device) on the smart device. In addition, a mirror or other angle altering device may be used in conjunction with a CCD, LIDAR or other energy receiving device.

Movements of a Smart Device 501 equipped with an antenna array can be determined via relative positions of the antenna and/or via operation of an accelerometer 524 within the Smart Device 501 or Smart Receptacle 502. Rough movement sense may be inferred with a single source to the antenna array. However, with multiple sources, the positional movement of each of the antennas can be used to sense many types of movements including translations and rotations.

A user may position the smart device 501 such that an object in a direction of interest is within in the CCD view. The smart device may then be moved to reposition one or more of the transceivers 503-510 from a first position to a second position and thereby capture the direction of interest via a generation of a vector in the direction of interest.

In addition to movement of the Smart Device 501 and/or the Smart Receptacle 502 may include a magnetic force detection device 523, such as a magnetometer. A registration of a magnetic force may be determined in relation to a particular direction of interest 524-525 and a subsequent determination of magnetic force referenced or provide a subsequent orientation of the Smart Device 501 or Smart Receptable 502.

In some embodiments, the magnetic force detection device 523 may be used combination with, or in place of directional movement of the Smart Device transceivers 503-507 to quantify a direction of interest to a user. Embodiments may include an electronic and/or magnetic sensor to indicate a direction of interest when a Smart Device 501 and/or Smart Receptacle 502 is aligned in a direction of interest. Alignment may include, for example, pointing a specified side of a Smart Device 501 and/or Smart Receptacle 502, or pointing an arrow or other symbol displayed upon a user interface on the Smart Device 501 towards a direction of interest.

A magnetic force detection device 523 may detect a magnetic field particular to a setting that a Smart Device is located. For example, in some embodiments, a particular structure or other setting may have a magnetic force that is primarily subject to the earth's magnetic field or may be primarily subject to electromagnetic forces from equipment, power lines, or some other magnetic influence or disturbance. An initial quantification of a magnetic influence at a first instance in time may be completed and may be compared to a subsequent quantification of magnetic influence at a later instance in time. In this manner an initial direction of interest indicated by a position, orientation, pitch and yaw of a Node, such as a Smart Device may be compared to a subsequent position, orientation, pitch and yaw of the Smart Device.

In some embodiments, an initial position, pitch and yaw of a Smart Device 501 may be described as a relative angle to a presiding magnetic force. Examples of presiding magnetic forces include, magnetic influences of electrical charges, Earth's magnetic field, magnetized materials, permanent magnetic material, strong magnetic fields, ferromagnetism, ferrimagnetism, antiferromagnetism, paramagnetism, and diamagnetism, or electric fields that are generated at reference nodes at known positions which may be locally used to indicate a direction of interest.

Smart devices may include electronic magnetic sensors as part of their device infrastructure. The magnetic sensors may typically include sensing elements deployed along three axis. In some examples, the magnetic sensors may be supplemented with electronic accelerometers, such as MEMS accelerometers.

In some examples the magnetic sensors may measure a sensed magnetic field perpendicular to the body of the sensor through a Hall Effect sensor. In some examples, a Hall Effect sensor may be built into silicon to generate a relatively sensitive sensing capability for magnetic fields. In some hall effect sensors, electrons and holes flowing in a region of the silicon may interact with the regional magnetic field and build up on the fringes of the conduction region, thus generating a measurable voltage potential. In other examples, anisotropic magnetoresistance sensors may sensitively detect the magnetic field at the device as a significant change in resistance of structure elements in the device.

In still further examples, giant magnetoresistance (GMR) sensors may detect the magnetic field. In some of these examples, the GMR sensors may detect a magnetic field with a current-perpendicular-to-plane (CPP) GMR configuration. In other examples a current in plane (CIP) GMR sensor configuration may be used. The resulting three axis magnetic sensors may perform a sensitive compass function to determine a direction of a specified portion of the smart device and/or an edge of the smart device relative to the local magnetic field environment. A specified portion of the Smart Device may be indicated via a user interface presented on a screen of the Smart Device.

Figure 5B:
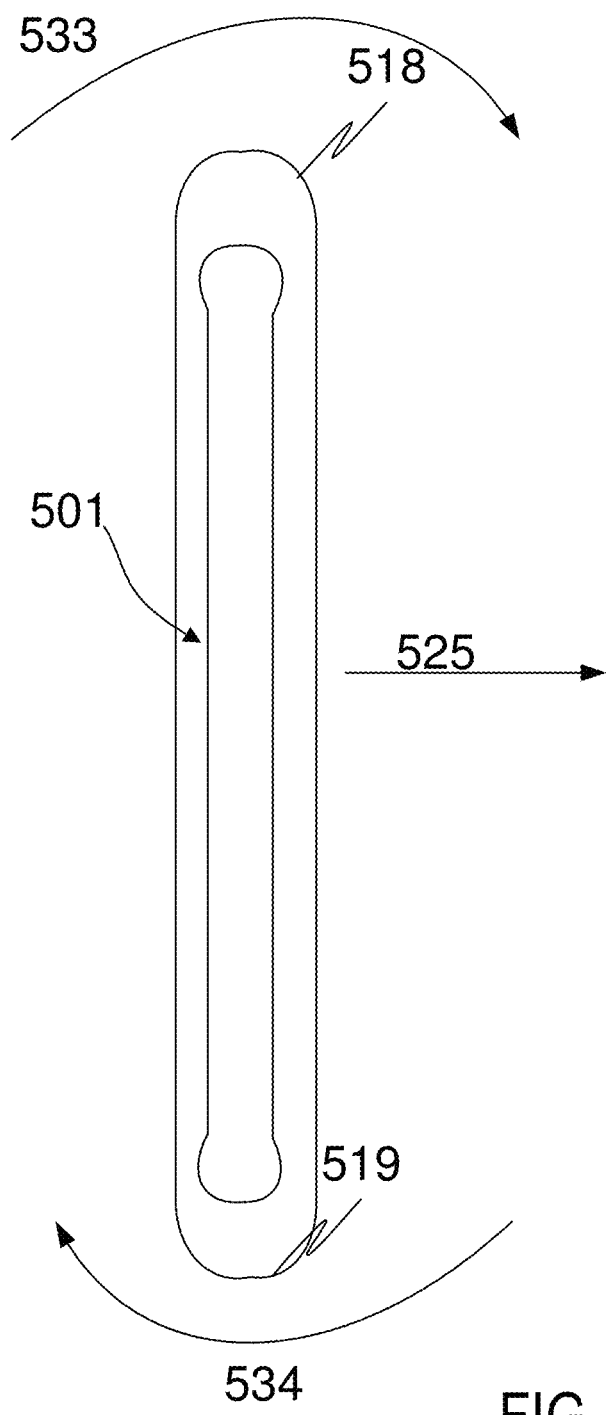
FIG. 5B illustrates a direction determination of a smart device.

Referring now to FIG. 5B, as illustrated, a vector in a direction of interest 525 may be based upon a rocking motion 533-534 of the smart device 501, such as a movement of an upper edge 518 in a forward arcuate movement 533. The lower edge 519 may also be moved in a complementary arcuate movement 534 or remain stationary. The movement of one or both the upper edge 518-519 also results in movement of one or more transceivers 503-510 and/or registration in an onboard accelerometer 534. The movement of the transceivers 503-510 will preferably be a sufficient distance to register disparate geospatial positions based upon wireless transmissions and/or sufficient to register movement via the accelerometer 534.

As presented herein, a direction dimension may be based upon one or more of: a wireless position of two or more transceivers, a movement of a device, a magnetic force determination, a LIDAR transmission and receiving, CCD energy determinations and other assessments of an environment containing the Smart Device and/or Smart Receptacle. For example, a device with a controller and an accelerometer, such as mobile Smart Device, may include a user display that allows a direction to be indicated by movement of the device from a determined location acting as a base position towards a feature in the intended direction where the movement results in an extended position. In some implementations, the Smart Device may first determine a first position based upon triangulation with the reference points and a second position (extended position) also based upon triangulation with the reference points.

As described above, facing a mobile device towards an area in a Structure and movement of the mobile device in a particular pattern may be used to ascertain a specific area in space to be interpreted by various methods.

Figure 5C:
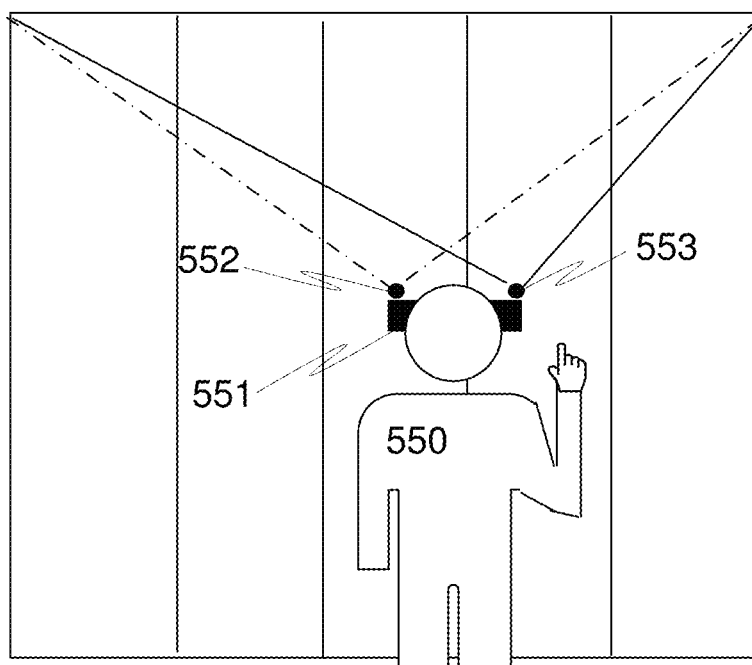
FIG. 5C illustrates embodiments of the invention that include stereoscopic cameras.

Referring to FIG. 5C, an illustration of an Agent 550 utilizing an oriented stereoscopic camera system 551 to orient a direction of interest is shown. The stereoscopic camera system 551 may obtain two different images from different viewpoints 552-553 which may be used to create topographical shape profiles algorithmically. A controller may obtain the image and topographic data and algorithmically compare them to previously stored images and topographic data in the general environment of the user. The resulting comparison of the imagery and topography may determine an orientation in space of the Agent 501 and in some examples determine a device field of view. The controller may utilize this determined field of view for various functionality as described herein.

Figure 6:
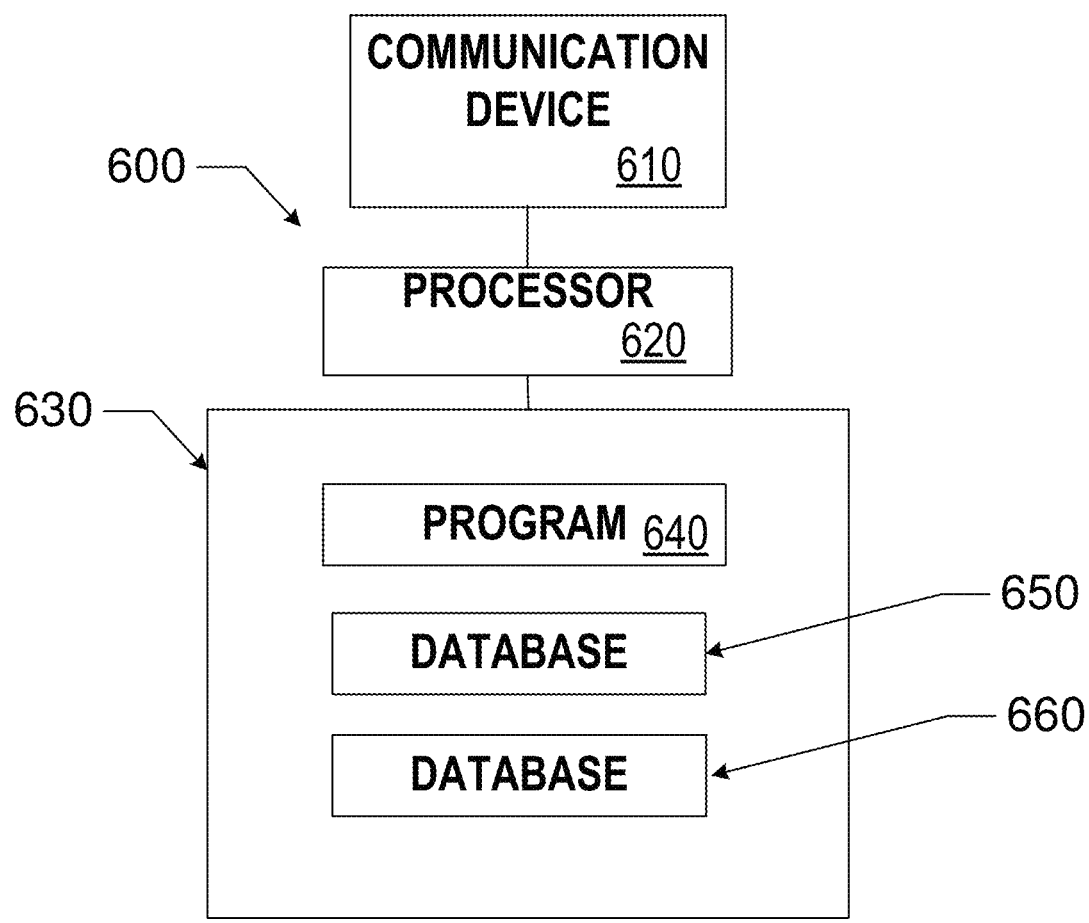
FIG. 6 illustrates apparatus that may be used to implement aspects of the present invention including executable software.

Referring now to FIG. 6 an automated controller is illustrated that may be used to implement various aspects of the present invention, in various embodiments, and for various aspects of the present invention, controller 600 may be included in one or more of: a wireless tablet or handheld device, a server, a rack mounted processor unit. The controller may be included in one or more of the apparatus described above, such as a Smart Device, Smart Tablet, Headgear, Smart Watch Smart Ring or other Smart Device. The controller 600 includes a processor unit 620, such as one or more semiconductor based processors, coupled to a communication device 610 configured to communicate via a communication network (not shown in FIG. 6). The communication device 610 may be used to communicate, for example, via a distributed network such as a cellular network, an IP Protocol network, the Internet or other distributed logic communication network.

The processor 620 is also in communication with a storage device 630. The storage device 630 may comprise any appropriate information storage device, including combinations of digital data storage devices (e.g., Solid State Drives and hard disk drives), optical storage devices, and/or semiconductor memory devices such as Random Access Memory (RAM) devices and Read Only Memory (ROM) devices.

The storage device 630 can store a software program 640 with executable logic for controlling the processor 620. The processor 620 performs instructions of the software program 640, and thereby operates in accordance with the present invention. The processor 620 may also cause the communication device 610 to transmit information, including, in some instances, control commands to operate apparatus to implement the processes described above. The storage device 630 can additionally store related data in a database 650 and database 660, as needed.

Figure 7:
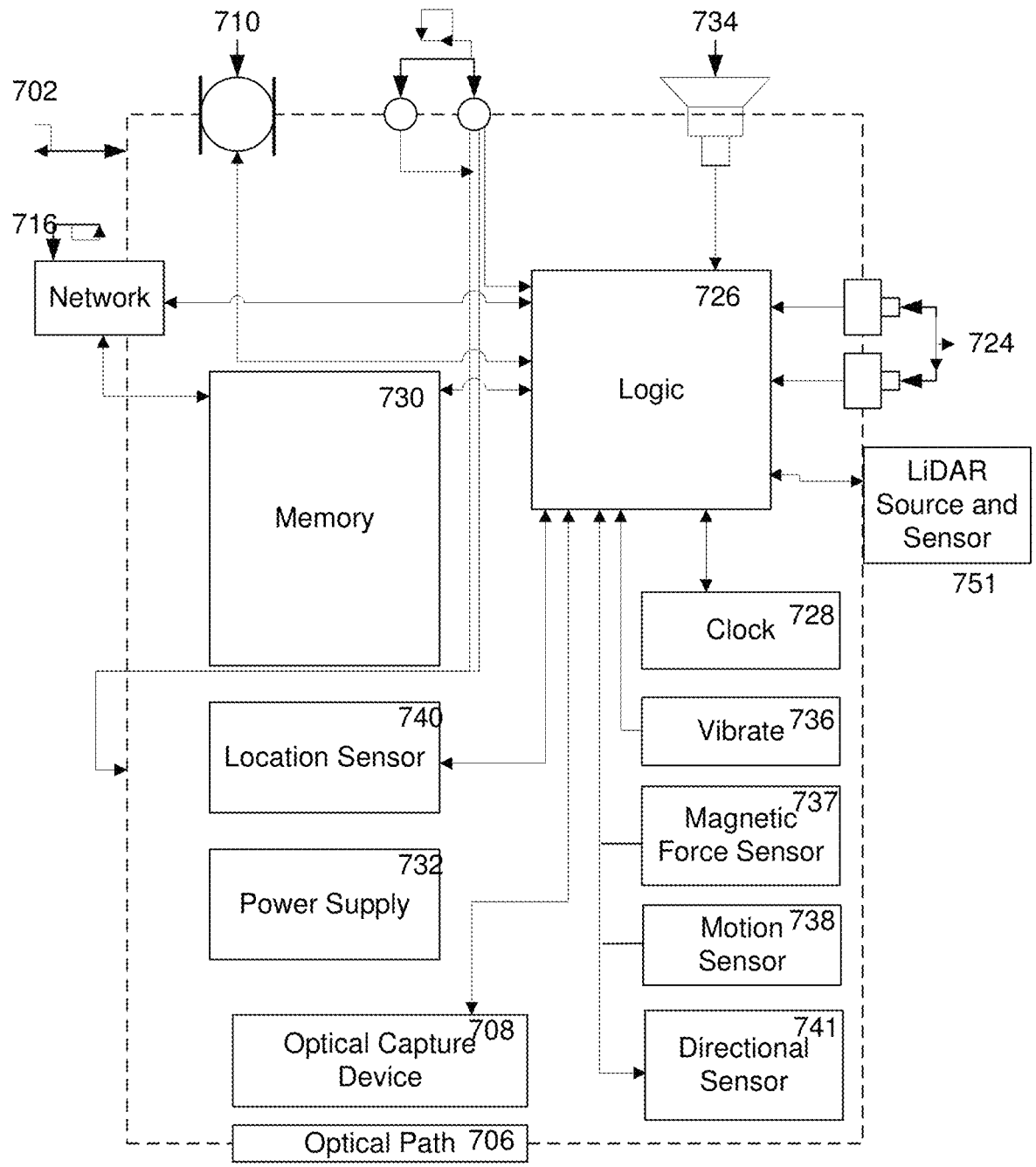
FIG. 7 illustrates an exemplary smart device that may be used to implement aspects of the present invention including executable software.

Referring now to FIG. 7, a block diagram of an exemplary smart device 702. The smart device 702 comprises an optical capture device 708 to capture an image and convert it to machine-compatible data, and an optical path 706, typically a lens, an aperture or an image conduit to convey the image from the rendered document to the optical capture device 708. The optical capture device 708 may incorporate a Charge-Coupled Device (CCD), a Complementary Metal Oxide Semiconductor (CMOS) imaging device, or an optical Sensor 724 of another type.

A microphone 710 and associated circuitry may convert the sound of the environment, including spoken words, into machine-compatible signals. Input facilities may exist in the form of buttons, scroll wheels, or other tactile Sensors such as touch-pads. In some embodiments, input facilities may include a touchscreen display.

Visual feedback to the user is possible through a visual display, touchscreen display, or indicator lights. Audible feedback 734 may come from a loudspeaker or other audio transducer. Tactile feedback may come from a vibrate module 736.

A magnetic force sensor 737, such as a Hall Effect Sensor, solid state device, MEMS device or other silicon based or micro-electronic apparatus.

A motion Sensor 738 and associated circuitry converts motion of the smart device 702 into a digital value or other machine-compatible signals. The motion Sensor 738 may comprise an accelerometer that may be used to sense measurable physical acceleration, orientation, vibration, and other movements. In some embodiments, motion Sensor 738 may include a gyroscope or other device to sense different motions.

A location Sensor 740 and associated circuitry may be used to determine the location of the device. The location Sensor 740 may detect Global Position System (GPS) radio signals from satellites or may also use assisted GPS where the mobile device may use a cellular network to decrease the time necessary to determine location. In some embodiments, the location Sensor 740 may use radio waves to determine the distance from known radio sources such as cellular towers to determine the location of the smart device 702. In some embodiments these radio signals may be used in addition to GPS.

The smart device 702 comprises logic 726 to interact with the various other components, possibly processing the received signals into different formats and/or interpretations. Logic 726 may be operable to read and write data and program instructions stored in associated storage or memory 730 such as RAM, ROM, flash, SSD, or other suitable memory. It may read a time signal from the clock unit 728. In some embodiments, the smart device 702 may have an on-board power supply 732. In other embodiments, the smart device 702 may be powered from a tethered connection to another device or power source.

The smart device 702 also includes a network interface 716 to communicate data to a network and/or an associated computing device. Network interface 716 may provide two-way data communication. For example, network interface 716 may operate according to the internet protocol. As another example, network interface 716 may be a local area network (LAN) card allowing a data communication connection to a compatible LAN. As another example, network interface 716 may be a cellular antenna and associated circuitry which may allow the mobile device to communicate over standard wireless data communication networks. In some implementations, network interface 716 may include a Universal Serial Bus (USB) to supply power or transmit data. In some embodiments other wireless links may also be implemented.

As an example of one use of smart device 702, a reader may scan some coded information from a location marker in a facility with the smart device 702. The coded information may include for example, a hash code, bar code, RFID or other data storage device. In some embodiments, the scan may include a bit-mapped image via the optical capture device 708. Logic 726 causes the bit-mapped image to be stored in memory 730 with an associated time-stamp read from the clock unit 728. Logic 726 may also perform optical character recognition (OCR) or other post-scan processing on the bit-mapped image to convert it to text. Logic 726 may optionally extract a signature from the image, for example by performing a convolution-like process to locate repeating occurrences of characters, symbols or objects, and determine the distance or number of other characters, symbols, or objects between these repeated elements. The reader may then upload the bit-mapped image (or text or other signature, if post-scan processing has been performed by logic 726) to an associated computer via network interface 716.

As an example of another use of smart device 702, a reader may recite words to create an audio file by using microphone 710 as an acoustic capture port. Logic 726 causes audio file to be stored in memory 730. Logic 726 may also perform voice recognition or other post-scan processing on the audio file to convert it to text. As above, the reader may then upload the audio file (or text produced by post-scan processing performed by logic 726) to an associated computer via network interface 716.

A directional sensor 741 may also be incorporated into the smart device 702. The directional device may be a compass and be based upon a magnetic reading, or based upon network settings. The magnetic sensor may include three axes of magnetic sensitive elements and may also be coupled with an accelerometer in the directional sensor 741.

A LiDAR sensing system 751 may also be incorporated into the smart device 702. The LiDAR system may include a scannable laser light (or other collimated) light source which may operate at nonvisible wavelengths such as in the infrared. An associated sensor device, sensitive to the light of emission may be included in the system to record time and strength of returned signal that is reflected off of surfaces in the environment of the smart device 702.

In the following sections, detailed descriptions of examples and methods of the invention will be given. The description of both preferred and alternative examples though through are exemplary only, and it is understood that to those skilled in the art that variations, modifications and alterations may be apparent. It is therefore to be understood that the examples do not limit the broadness of the aspects of the underlying invention as defined by the claims.

Figure 8A:
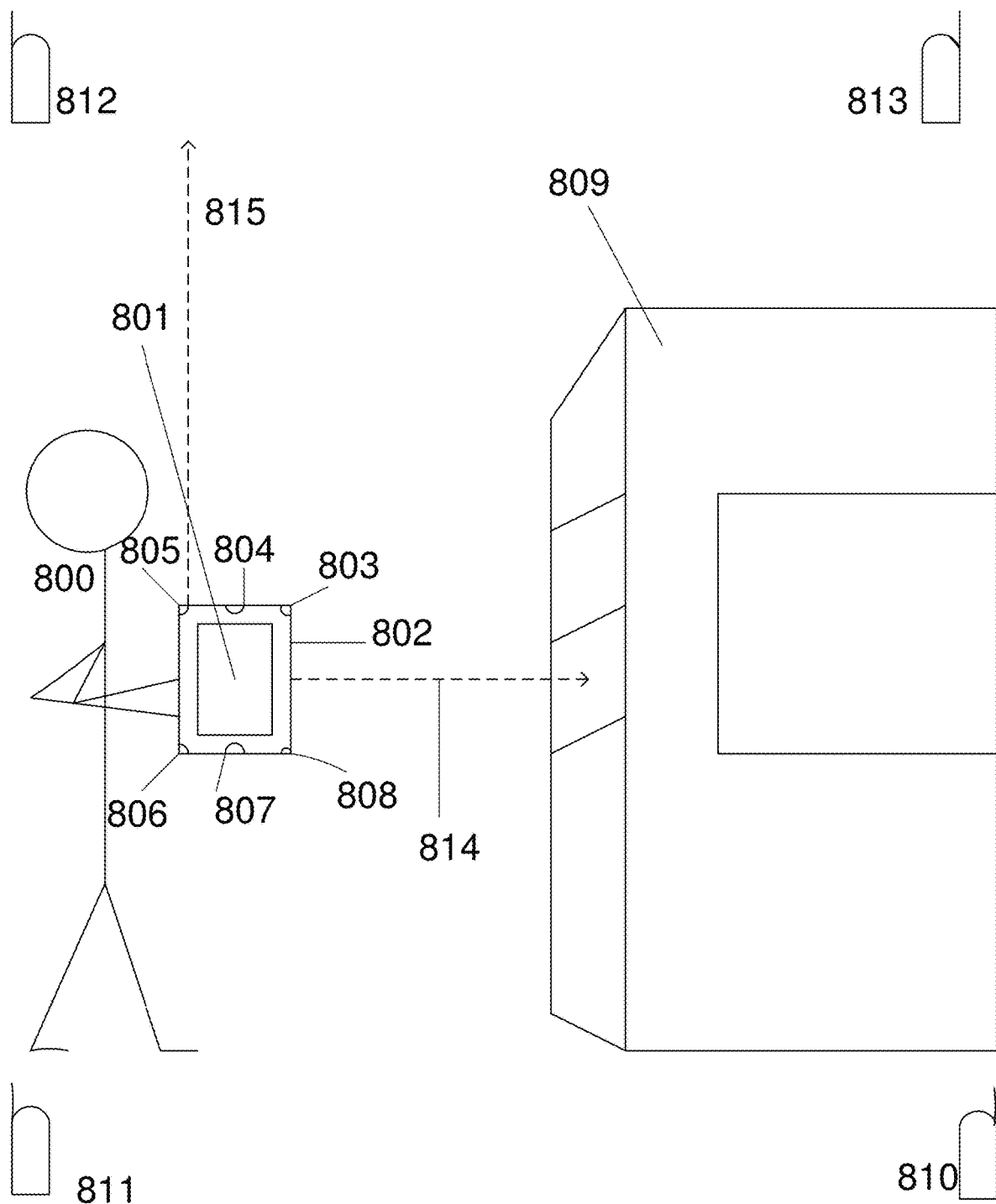
FIG. 8A-8C illustrate movements for determining a direction of interest of a smart device.
Figure 8B:
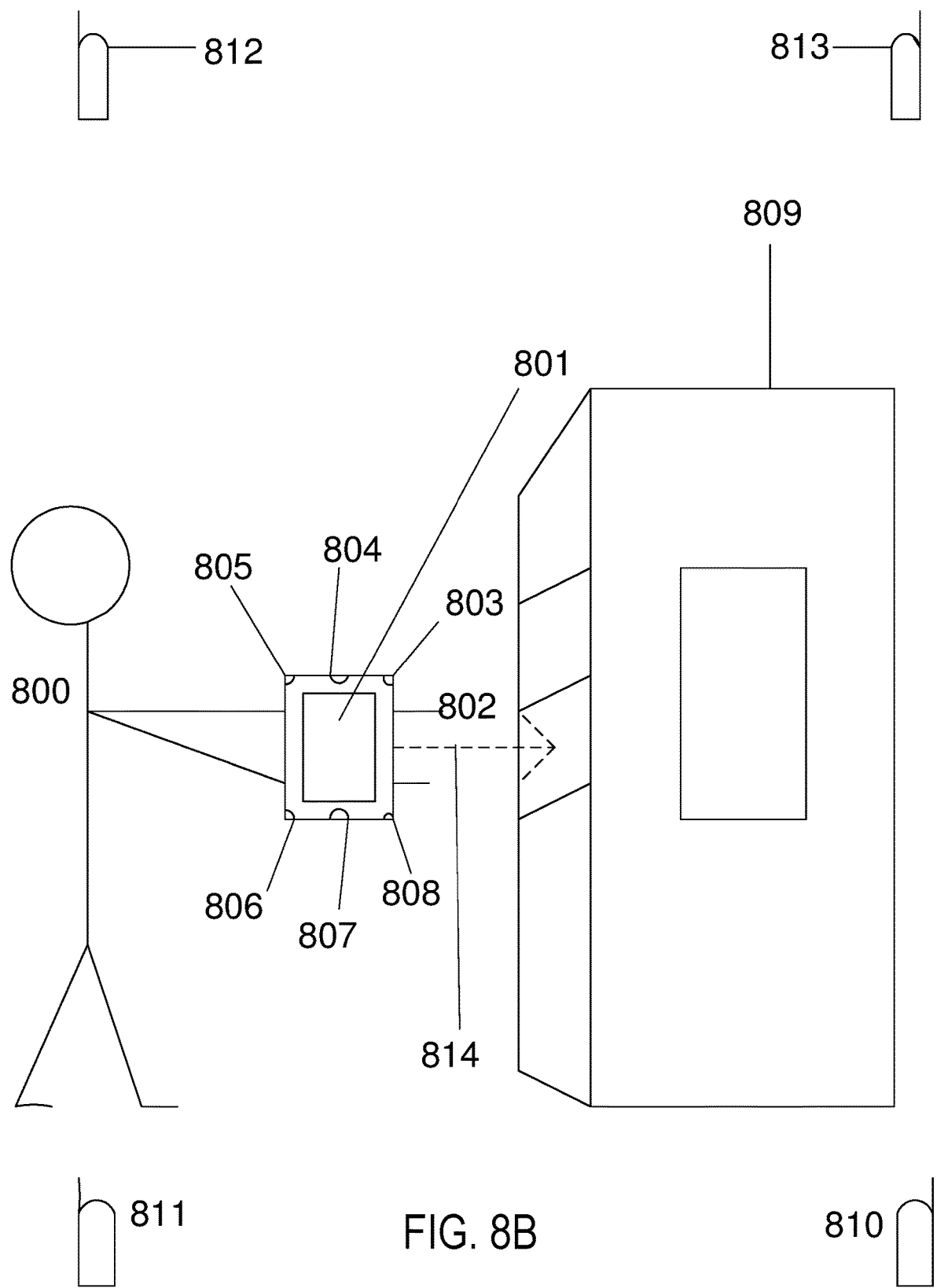
Figure 8C:
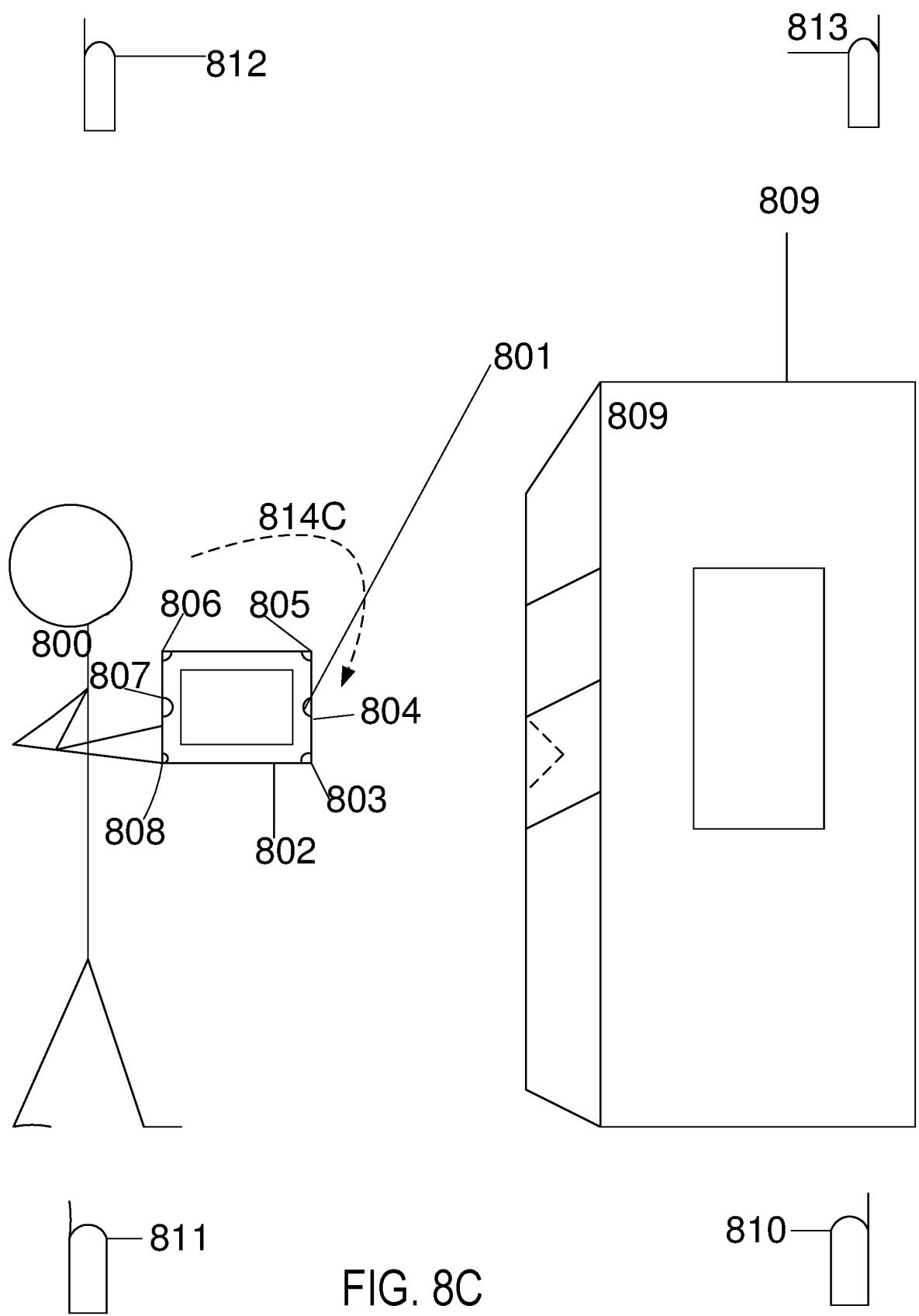

Referring now to FIGS. 8A-8C, a support 800 for a smart device 801 is illustrated. The support remains stationary in relation to a ground plane. One or more position devices 803-808 are shown located within, on or proximate to the smart device 801. In FIG. 8A, generally linear movement 814-815 from a first position to a second position is illustrated. In some embodiments, a cessation of movement in a general direction is determined via an accelerometer 802 included in or operated by the smart device 801. In other embodiments (show here as the support 800) may activate a user interactive device, such as a button on a touch screen, or a switch to indicate one or both of the first position and the second position.

The transceivers 803-808 enter into logical communication with multiple wireless positional reference transceivers 810-813.

In some embodiments, a direction of interest will include an item of interest 809, such as an apparatus or other piece of equipment. A direction of interest 814 may include a vector with a direction pointing towards the item of interest 809. The vector length will be sufficient to reach the item of interest 809.

In some embodiments, a vector indicating a direction of interest 814 may be used to reference stored data, such as, for example, digital data stored in a database, an AVM, URL, cloud storage or other storage medium. A user interface may include a drop down menu that includes potential items of interest 809 in a general direction of the vector.

In some embodiments, a selection of an item of interest may be used to facilitate determination of a length of the vector 814.

Referring now to FIG. 8C, a movement of a smart device 801 may be arcuate in nature 814C so long as arcuate movement 814C results in sufficient distance of movement of one or more position devices 803-808.

Figure 9:
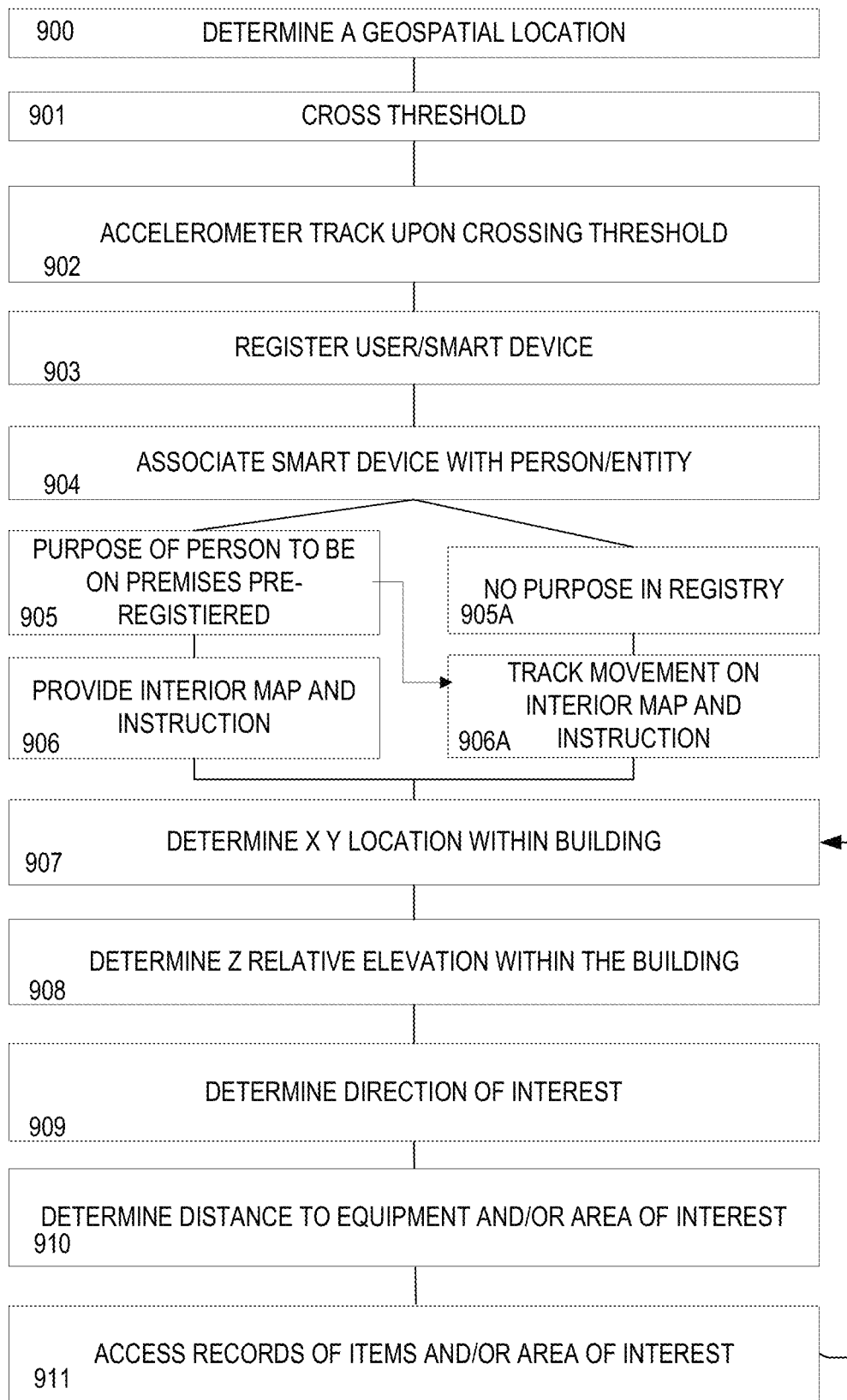
FIG. 9 illustrates method steps that may be implemented according to some aspects of the present invention.

Referring now to FIG. 9, method steps that may be implemented in some embodiments of the present invention are illustrated. At method step 900, geospatial location services are used to determine geospatial location such as a location of the structure with a position and direction of interest. Geospatial services may be used to determine a user's location relative to the structure and directions thereto. The methods used may include, by way of non-limiting example, one or more of: satellite-based global positioning systems (GPS), cell tower triangulation, radio signal triangulation, Wi-Fi signal location services, infrared transmitters and the like.

Geospatial location services will be cross-referenced with database registry of as built virtually modeled facilities and may be used in conjunction with a network of registered service technicians to route the nearest available service technician to the structure experiencing equipment area of interest. Service technician may register with the system to accept geospatial location tracking services by the system.

At method step 901, the service technician's entry into the structure will be registered. Registration of entry into the structure may be achieved through multiple methods, which may include, by way of non-limiting example, on or more of: WiFi gateway detection, infrared detection, magnetic door locking systems, Bluetooth services, and the like. Upon entry into the structure requesting the service call, system will register the service technician's entry into the structure.

At method step 902, a support unit for a smart device, such as service technician or an unmanned vehicle may be tacked via a change in triangulation values and/or an accelerometer and a position and direction within the structure is tracked. The methods used may be, by means of non-limiting example, one or more of: use of data gleaned from accelerometers located on or in possession of service technicians, Wifi services, radio frequency (RF) triangulation, Bluetooth technology, infrared detection, RFID badges, and the like.

At method step 903, a smart device will be registered as entering within structure. Following the smart device entry into structure.

At method step 904, a smart device may be associated with one or both of a person and an entity.

At method step 905, the smart device is pre-registered by the system with detailed instructions regarding a reason for the device to be at a particular location. The reason may be, for example, one or more of: a service call placed from structure to system detailing current equipment area of interest, service calls from structure detailing non-specific area of interests and symptomatic data indicating equipment area of interest, a service call placed by self-assessing equipment utilizing internet of things (IoT) and machine learning functionality to ascertain area of interests and predictive analytics to anticipate area of interests, and the like. The system may integrate data reports into the AVM and relay as much to the smart device in the field.

Alternatively, at method step 905A, the smart device may arrive at the structure without prior knowledge of a purpose. Upon entry into the structure and registration of the smart device as described in method steps 901 through 904, system will relay data gleaned from the AVM, operational data uploaded to the system through IoT processes, and other experiential data reported to the system and thereby relayed to the smart device on site. Methods for relation of such data to the onsite smart device may include, by means of non-limiting example, referential data based on proprietary orienteering processes to determine smart device location within structure, which location will be cross-referenced with AVM data. At method step 906A, the system may track movement on interior map and give instruction.

At method step 906, a position within or proximate to the structure may be determined via positioning identifiers. The position within or proximate to the structure is determined and detailed instructions directing smart device to the source of an area of interest is relayed by the system to the smart device directly or by means of smart device application. The methods used may be, by means of non-limiting example, one or more of: augmented reality overlays displayed on heads-up displays or other wearable technologies, augmented reality overlays displayed on smart devices, direct instructional vectoring provided to the smart device by the system over Wifi internet connection or LTE signal, virtual reality walkthrough instructions provided to smart device on site or prior to arrival at the structure, updated map/schematic displays detailing the structure and directing the smart device to the source of the subject area of interest by means of vectoring and orienteering processes.

At method step 907, a smart device's location within the structure along an XY axis will be tracked and recorded by the system by means of fixed or adaptive orienteering apparatus within the structure. Such orienteering apparatus may include, by means of non-limiting example, on or more of: radio frequency (e.g. UWB, WiFi, sub GHz, etc.) triangulation, infrared position detection, radio frequency (RF) detection, RF ID tracking, onboard accelerometers located on the smart device or carried smart devices, quantification of magnetic fields, topographical pattern recognition, and the like.

At method step 908, the smart device's location within the structure along the Z axis will be determined. The methods used may be, by means of non-limiting example, one or more of: Smart Device integrated magnetometers, Smart Device integrated barometers, Smart Device integrated accelerometers, Smart Device integrated tilt sensors, used in conjunction with in-structure XY axis position processes described in method step 097 above, along with data detailed in a database or model of the structure.

At method step 909, the smart device's direction of interest will be determined. Method steps 901 through 909 work in conjunction to track and direct the smart device to an area of interest; as the smart device approaches an area of interest, the smart device will be oriented to the area of interest. The system will determine the smart device's direction of interest using, by means of non-limiting example, one or more of the following methods: generation of a vector based upon multiple locations of transceiver(s), wherein the transceiver locations may be associated with a single transceiver at two different locations, or disparate transceivers located at respective locations; a transceiver location and an AoA or AoD combined with a distance; infrared pointers, laser direction finding devices, Smart Device integrated CCDs; LIDAR Wifi triangulation, and the like.

Figure 10:
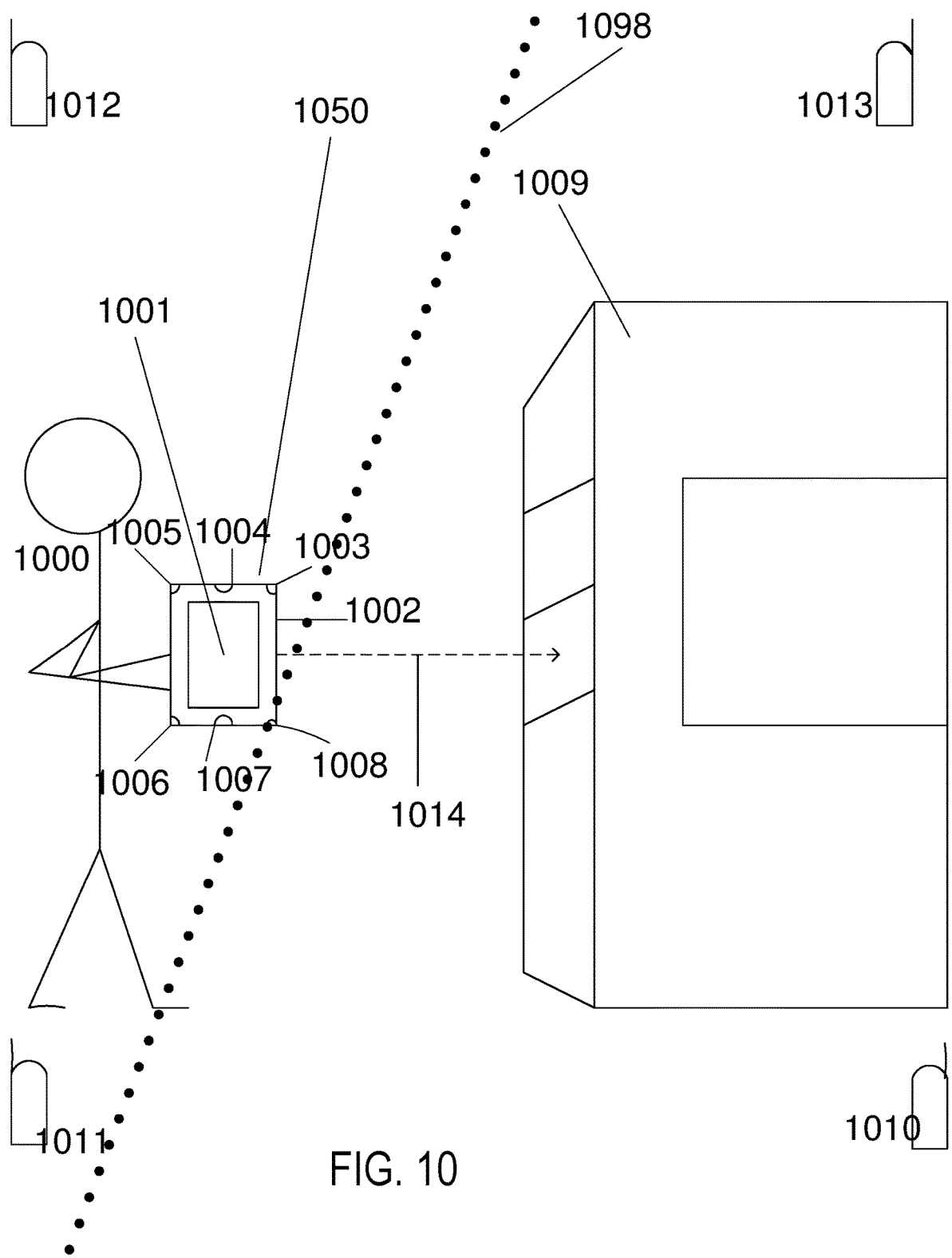
FIG. 10 illustrates an Agent supporting a smart device.

At method step 910, the smart device's distance to the subject area of interest will be determined. The methods used may be, by means of non-limiting example, one or more of: time of flight of a transmitted signal, RTT, phase differentiation, and the like. At method step 911 the user may access records of interest and/or area of interest. Referring to FIG. 10, a user 1000 is illustrated with an orientation of the smart device 1001. One or more position devices 1002-1008 are shown located within, on or proximate to the smart device 1001. The smart device 1001 may include an electronic magnetic sensor 1050. The electronic magnetic sensor 1050 may quantify an ambient magnetic field and generate an orientation of the smart device 1001 along three axes of the ambient magnetic field that correlates with the quantified ambient magnetic field. In some embodiments, a direction of interest 1014 may be quantified in terms of an angle relative to the three axes of the ambient magnetic field 1098.

The transceivers 1003-1008 enter into logical communication with multiple wireless positional reference transceivers 1010-1013 to generate data sufficient to quantify a physical position of the transceivers 1010-1013 and an orientation of the smart device.

In some embodiments, a direction of interest will permit identification of an item of interest 1009, such as an apparatus or other piece of equipment or a direction into the environment. A direction of interest 1014 may include a vector with a direction pointing towards the area of interest 1009. The vector length may be sufficient to reach the item of interest 1009.

Figure 11:
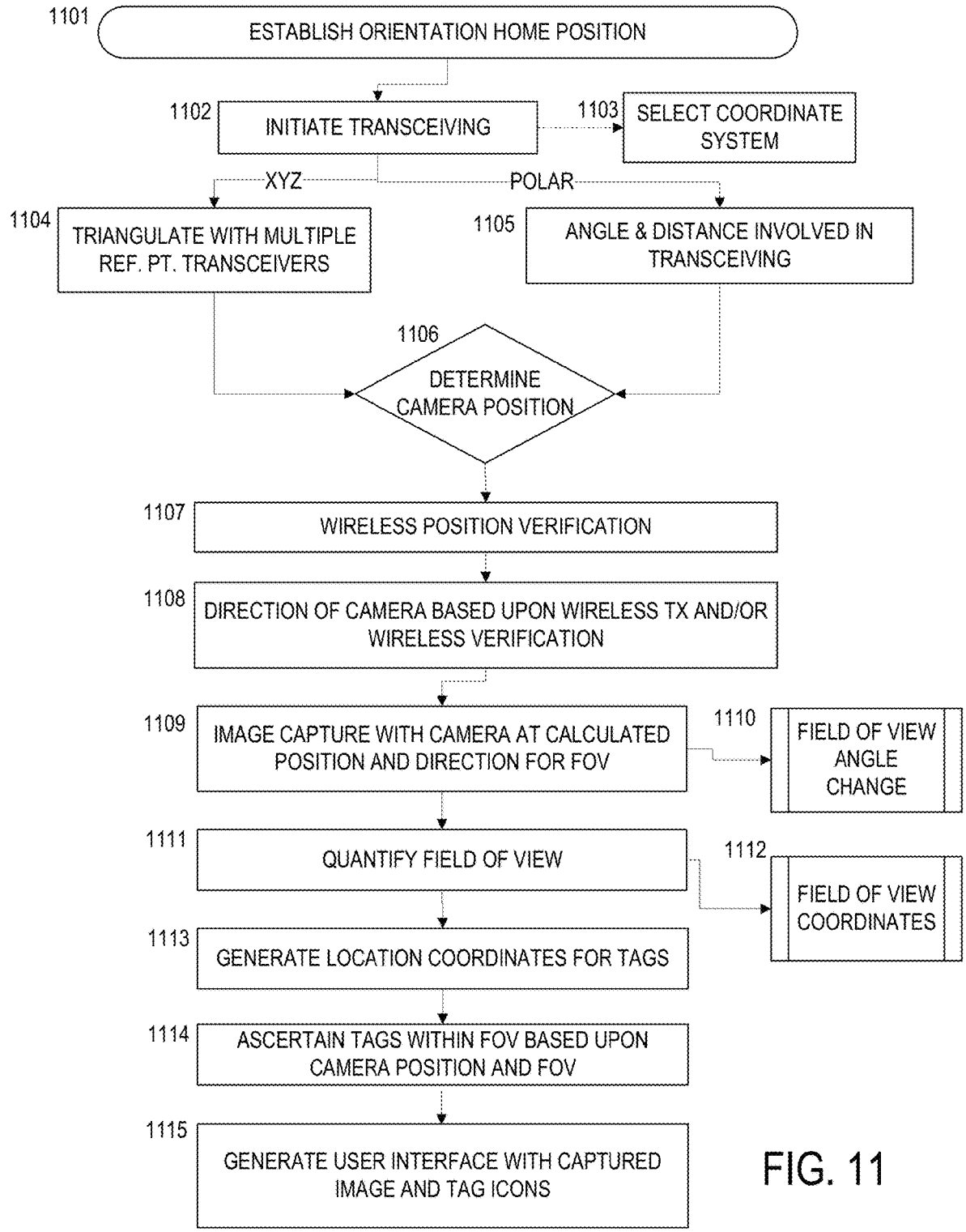
FIG. 11 illustrates method steps that may be implemented in some embodiments of the present invention.

Referring to FIG. 11 in some cases, it may be prohibitively inefficient or expensive to "tag" or associate a Node or Smart Device with every item to be monitored. For example, it may be cost and time prohibitive to assign each product being stored in the Facility with a Node or Smart Device. As such, other methods of monitoring the products and other items may be used. In some embodiments of the invention, an item may be assigned a "Virtual Tag," in which a Smart Device can identify an object in its field of view and capture its location coordinates based on the position of the Smart Device. A "Virtual Tag" or "icon" may be generated in the Smart Device's field of view at those coordinates and saved in the digital memory. Information regarding the object may also be saved with the spatial coordinates. This information can be transmitted to the monitoring system so that others may find the object by routing to the particular coordinates. In addition, when that Smart Device, or another Smart Device in logical communication with the monitoring system, views the particular location, the Smart Device will identify that a virtual tag exists at that location with, for example, an icon. The icon may also be interactive so that information associated with the object may be known. Thus, the monitoring system may be in logical communication with both physical tags such as Smart Devices or Nodes and with Virtual Tags created by a Smart Device. This will be described in further detail below.

Creating of Virtual Tags may, in some embodiments, performed using the following steps: in a first step 1101, an orientation home position is established. At step 1102, the Smart Device initiates transceiving and at step 1103, a coordinate system is selected. If Cartesian coordinate system is selected, at step 1104, the Smart Device may triangulate with Reference Point Transceivers/Nodes to determine the position of the Image Capture Device in the Smart Device (step 1106). If a polar coordinate system is selected, at Step 1105, an angle and distance involved in transceiving is measured, and the camera position is determined (step 1106). In some embodiments, the Image Capture Device may be a camera, including a charge-coupled device (CCD), or a LIDAR apparatus, including a solid-state LIDAR or a MEMS-based LIDAR.

At step 1107, the position of any Nodes or Reference Point Transceivers is verified, and in step 1108, the direction of the Image Capture Device is determined based on the methods described herein, using the Smart Device and any Nodes or Reference Point Transceivers nearby.

At step 1109, the Image Capture Device captures an image. This may be done by capture of wireless energy of a first wavelength is received into a wireless receiver in the Smart Device. In exemplary embodiments, this step may comprise receiving image data based on visible light into a camera of the smart device. The wireless energy may be dispersed over a one-, two-, or three-dimensional space in a defined physical area, and may be received into a one-, two-, or three-dimensional array in the receiver. The wireless energy may take the form of electromagnetic radiation, such as light in the human-visible light spectrum (generally having a wavelength between 380 nm-740 nm), ultraviolet light (generally having a wavelength between 10.0 nm-400 nm), or infrared light (generally having a wavelength between 740 nm-2.00 mm). The set of wireless energy available to the wireless receiver is the smart device's Field of View. In step 1110, the Field of View may change as the angle or position of the Smart Device changes.

In step 1111, the Field of View is quantified. In some embodiments, a pattern of digital values is generated based upon receipt of wireless energy into the wireless receiver. This pattern of digital values may be based on one or more qualities of the received wireless energy, including its intensity, spatial dispersion, wavelength, or angle of arrival. The pattern may be placed into an appropriate array. For example, if the display of the smart device is a two-dimensional display, then the pattern of digital values may comprise a two-dimensional representation of the image data received. In some embodiments, the pattern of digital values may be based on an aggregated set of values from an array of receivers. For example, if the basis of the digital values is the intensity of the wireless energy received into the receiver, then the digital value assigned to a given entry in the array may be based on a weighted average of intensity of wireless energy received at a plurality of the receivers in the array. The set of digital values within the Field of View is the Digital Field of View. In step 1112, optionally, the coordinates of the space in the Digital Field of View may also be determined. Any suitable method may be used, but in some embodiments, LIDAR may be used to determine the presence and distance from the Smart Device of various items in the Field of View and therefore determine the position of items. In step 1113, items or space in the Field of View may be "tagged" such as via a touch screen or cursor. Using similar steps for step 1112, the location coordinates for the Virtual Tags may be known and transmitted, for example, to a monitoring system or controller.

Referring to step 1114, when a Smart Device that is part of the monitoring system approaches the location of the Virtual Tag, the Smart Device will identify that the Virtual Tag is within the Smart Device's Field of View. In step 1115, when this occurs, the Smart Device will generate an icon in the position of the Virtual Tag. This icon may be interactive so that information regarding the location or Virtual Tag may be ascertained. For example, the Virtual Tag may provide a location and environmental history of the product at the coordinates, as will be discussed in further detail below.

Glossary

"Agent" as used herein refers to a person or automation capable of supporting a Smart Device at a geospatial location relative to a Ground Plane.

"Ambient Data" as used herein refers to data and data streams captured in an environment proximate to a Vantage Point and/or an equipment item that are not audio data or video data. Examples of Ambient Data include, but are not limited to Sensor perception of: temperature, humidity, particulate, chemical presence, gas presence, light, electromagnetic radiation, electrical power, moisture and mineral presence.

"Analog Sensor" and "Digital Sensor" as used herein include a Sensor operative to quantify a state in the physical world in an analog representation.

"As Built" as used herein refers to details of a physical structure associated with a specific location within the physical structure or parcel and empirical data captured in relation to the specific location.

"As Built Features" as used herein refers to a feature in a virtual model or AVM that is based at least in part upon empirical data captured at or proximate to a correlating physical location of the feature. Examples of As Built Features include placement of structural components such as a wall, doorway, window, plumbing, electrical utility, machinery and/or improvements to a parcel, such as a well, septic, electric or water utility line, easement, berm, pond, wet land, retaining wall, driveway, right of way and the like.

"Augmented Virtual Model" (sometimes referred to herein as "AVM"): as used herein is a digital representation of a real property parcel including one or more three dimensional representations of physical structures suitable for use and As Built data captured descriptive of the real property parcel. An Augmented Virtual Model includes As Built Features of the structure and may include improvements and features contained within a Processing Facility.

"Bluetooth" as used herein means the Wireless Personal Area Network (WPAN) standards managed and maintained by Bluetooth SIG. Unless otherwise specifically limited to a subset of all Bluetooth standards, the Bluetooth will encompass all Bluetooth standards (e.g. Bluetooth 4.0; 5.0; 5.1 and BLE versions).

"Directional Indicator" as used herein shall mean a quantification of a direction generated via one or both of: analogue and digital indications.

"Directional Image Data" as used herein refers to image data captured from a Vantage Point with reference to a direction. Image data may include video data.

"Directional Audio" as used herein refers to audio data captured from a Vantage Point within or proximate to a property and from a direction.

"Digital Sensor" as used herein includes a Sensor operative to quantify a state in the physical world in a digital representation.

"Ground Plane" as used herein refers to horizontal plane from which a direction of interest may be projected.

"Image Capture Device" or "Scanner" as used herein refers to apparatus for capturing digital or analog image data, an Image capture device may be one or both of: a two dimensional camera (sometimes referred to as "2D") or a three dimensional camera (sometimes referred to as "3D"). In some examples an Image Capture Device includes a charged coupled device ("CCD") camera. "Intelligent Automation" as used herein refers to a logical processing by a device, system, machine or equipment item (such as data gathering, analysis, artificial intelligence, and functional operation) and communication capabilities.

"MultiModal" as used herein refers to the ability of a device to communication using multiple protocols and/or bandwidths. Examples of multimodal may include being capable of communication using two to more of: Ultra Wideband, Bluetooth; Bluetooth Low Energy; WiFi; WiFi RT; GPS; ultrasonic; infrared protocols and/or mediums.

"Node" as used herein means a device including at least a processor, a digital storage and a wireless transceiver.

"Proximate" as used herein means physically located within range of a relevant modality of wireless communication.

"Ray" as used herein refers to a straight line including a starting point and extending indefinitely in a direction.

"Sensor" as used herein refers to one or more of a solid state, electro-mechanical, and mechanical device capable of transducing a physical condition or property into an analogue or digital representation and/or metric.

"Smart Device" as used herein includes an electronic device including, or in logical communication with, a processor and digital storage and capable of executing logical commands.

"Smart Receptacle" as used herein includes a case or other receiver of a smart device with components capable of receiving wireless transmissions from multiple wireless positional reference transceivers. In some embodiments, the smart receptacle will include a wireless transmitter and/or a physical connector for creating an electrical path for carrying one or both of electrical power and logic signals between an associated Smart Device and the Smart Receptacle.

"Structure" as used herein refers to a manmade assembly of parts connected in an ordered way. Examples of a Structure in this disclosure include a building; a sub-assembly of a building; a bridge, a roadway, a train track, a train trestle, an aqueduct; a tunnel a dam, and a retainer berm.

"Transceive" as used herein refers to an act of at least one of: transmitting and receiving data.

"Transceiver" as used herein refers to an electronic device capable of one or both of wirelessly transmitting and receiving data.

"Ultra Wideband" sometimes referred to herein as "UWB" means a wireless communication modality which may engage a bandwidth generally greater than 500 MHz and transmit wireless energy in pulses.

"Vantage Point" as used herein refers to a specified location which may be an actual location within a physical environment or a virtual representation of the actual location within a physical environment.

"Vector" as used herein refers to a magnitude and a direction as may be represented and/or modeled by a directed line segment with a length that represents the magnitude and an orientation in space that represents the direction.

"Virtual Tag" as used here shall mean a reference point identified with a location in a virtual model of a space. It may have common aspects with an artificial reality anchor, reference anchor and the like. The tag may have numerous features and content associated with it including data values, user functionality, image data, video data and the like.

INCORPORATION BY REFERENCE TO RELATED APPLICATIONS

This application references the Non Provisional U.S. patent application Ser. No. 16/504,919, filed Jul. 8, 2019 and entitled METHOD AND APPARATUS FOR POSITION BASED QUERY WITH AUGMENTED REALITY HEADGEAR, the entire contents of which are hereby incorporated by reference. This application references and the Non Provisional patent application Ser. No. 16/688,775, filed Nov. 19, 2019 and entitled METHOD AND APPARATUS FOR WIRELESS DETERMINATION OF POSITION AND ORIENTATION OF A SMART DEVICE the entire contents of which are hereby incorporated by reference. This application references the Non Provisional patent application Ser. No. 16/503,878, filed Jul. 5, 2019 and entitled METHOD AND APPARATUS FOR ENHANCED AUTOMATED WIRELESS ORIENTEERING, the entire contents of which are hereby incorporated by reference. This application references the Non Provisional patent application Ser. No. 16/297,383, filed Jul. 5, 2019 and entitled SYSTEM FOR CONDUCTING A SERVICE CALL WITH ORIENTEERING, the entire contents of which are hereby incorporated by reference. This application references the Non Provisional patent application Ser. No. 16/249,574, filed Jan. 16, 2019 and entitled ORIENTEERING SYSTEM FOR RESPONDING TO AN EMERGENCY IN A STRUCTURE, the entire contents of which are hereby incorporated by reference. This application references the Non Provisional patent application Ser. No. 16/176,002, filed Oct. 31, 2018 and entitled SYSTEM FOR CONDUCTING A SERVICE CALL WITH ORIENTEERING, the entire contents of which are hereby incorporated by reference. This application references the Non Provisional patent application Ser. No. 16/171,593, filed Oct. 26, 2018 and entitled SYSTEM FOR HIERARCHICAL ACTIONS BASED UPON MONITORED BUILDING CONDITIONS, the entire contents of which are hereby incorporated by reference. This application references the Non Provisional patent application Ser. No. 16/165,517, filed Oct. 19, 2018 and entitled BUILDING VITAL CONDITIONS MONITORING, the entire contents of which are hereby incorporated by reference. This application references the Non Provisional patent application Ser. No. 16/161,823, filed Oct. 16, 2018 and entitled BUILDING MODEL WITH CAPTURE OF AS BUILT FEATURES AND EXPERIENTIAL DATA, the entire contents of which are hereby incorporated by reference. This application references the Non Provisional patent application Ser. No. 16/142,275, filed Sep. 26, 2018 and entitled METHODS AND APPARATUS FOR ORIENTEERING, the entire contents of which are hereby incorporated by reference. This application references the Non Provisional patent application Ser. No. 15/887,637, filed Feb. 2, 2018 and entitled BUILDING MODEL WITH CAPTURE OF AS BUILT FEATURES AND EXPERIENTIAL DATA, the entire contents of which are hereby incorporated by reference. This application references the Non Provisional patent application Ser. No. 15/716,53, filed Sep. 26, 2017 and entitled BUILDING MODEL WITH VIRTUAL CAPTURE OF AS BUILT FEATURES AND OBJECTIVE PERFORMANCE TRACKING, the entire contents of which are hereby incorporated by reference. This application references the Non Provisional patent application Ser. No. 15/703,310, filed Sep. 5, 2017 and entitled BUILDING MODEL WITH VIRTUAL CAPTURE OF AS BUILT FEATURES AND OBJECTIVE PERFORMANCE TRACKING, the entire contents of which are hereby incorporated by reference. This application references the Non Provisional patent application Ser. No. 16/528,104, filed Jul. 31, 2019 and entitled SMART CONSTRUCTION WITH AUTOMATED DETECTION OF ADVERSE STRUCTURE CONDITIONS AND REMEDIATION, the entire contents of which are hereby incorporated by reference. This application references the Non-Provisional U.S. patent application Ser. No. 16/657,660, filed Oct. 18, 2019 and entitled METHOD AND APPARATUS FOR CONSTRUCTION AND OPERATION OF CONNECTED INFRASTRUCTURE, the entire contents of which are hereby incorporated by reference. This application references the Non-Provisional U.S. patent application Ser. No. 16/721,906, filed Dec. 19, 2019 and entitled METHOD AND APPARATUS FOR WIRELESS DETERMINATION OF POSITION AND ORIENTATION OF A SMART DEVICE, the entire contents of which are hereby incorporated by reference. This application references the Non Provisional patent application Ser. No. 16/549,503, filed Aug. 23, 2019 and entitled METHOD AND APPARATUS FOR AUGMENTED VIRTUAL MODELS AND ORIENTEERING, the entire contents of which are hereby incorporated by reference. This application references the Non Provisional patent application Ser. No. 16/775,223, filed Jan. 28, 2020 and entitled SPATIAL SELF-VERIFYING ARRAY OF NODES, the entire contents of which are hereby incorporated by reference.

Particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order show, or sequential order, to achieve desirable results. In certain implementations, multitasking and parallel processing may be advantageous. Nevertheless, it will be understood that various modifications may be made without departing from the spirit and scope of the claimed invention.

What is claimed is:

1. Method for determining an orientation of a smart device relative to a structure, the method comprising the steps of:
   a) supporting a first transceiver and a second transceiver via an agent at a first geospatial position;
   b) generating respective logical communications between the first transceiver and each of a first set of three reference point transceivers, the three reference point transceivers fixedly positioned at disparate points in the structure;
   c) with a controller, determining X, Y and Z coordinates of the first transceiver based upon the respective logical communications between the first transceiver and each of a first set of three reference point transceivers;
   d) generating respective logical communications between the second transceiver and each of a second set of three reference point transceivers;
   e) with a controller, determining X, Y and Z coordinates of the second transceiver based upon the respective logical communications between the first transceiver and each of a first set of three reference point transceivers;
   f) generating a first quantification of a magnetic field encompassing the smart device with a magnetic field sensor;
   g) generating a location of the smart device based upon at least one of: X, Y and Z coordinates of the first transceiver, and the X, Y and Z coordinates of the second transceiver;
   h) generating a first direction of interest based upon at least two of: the X, Y and Z coordinates of the first transceiver, the X, Y and Z coordinates of the second transceiver, and the quantification of the magnetic field encompassing the smart device;
   i) accessing data associated with the location of the smart device and the first direction of interest; and
   j) generating a user interface on the smart device, the user interface comprising the data associated with the location of the smart device.

2. The method of claim 1 additionally comprising the steps of: reorienting the smart device; generating a second quantification of the magnetic field encompassing the smart device; and generating a second direction of interest based upon the second quantification of the magnetic field relative to the smart device.

3. The method of claim 2 wherein the magnetic field sensor comprises a Hall Effect sensor.

4. The method of claim 2 wherein one of the first transceiver and the second transceiver comprises a smart watch.

5. The method of claim 2 wherein one of the first transceiver and the second transceiver comprises a smart ring.

6. The method of claim 2 additionally comprising the steps of: reorienting the smart device; generating a topographical representation of at least a portion of an environment within an area capable of wireless communication the smart device and generating a second direction of interest based upon the topographical representation.

7. The method of claim 1 wherein the smart pointer comprises both the first transceiver and the second transceiver.

8. The method of claim 1 wherein at least one of the first set of three reference point transceivers comprises a multi-modality transceiver capable of transceiving in multiple frequency bandwidths.

9. The method of claim 8 wherein the multiple frequency bandwidths comprise bandwidths associated with two or more of: WiFi, Bluetooth, Ultra Wideband, infrared and ultrasonic modalities.

10. The method of claim 1 wherein the direction of interest is at an angle perpendicular to a screen on the smart device.

11. Apparatus for determining an orientation relative to a structure, the apparatus comprising:
   a) a controller comprising a processor and a digital storage, said controller in logical communication with a user interface display;
   b) a first transceiver supportable by an Agent at a first geospatial position and in logical communication with the controller;
   c) and a second transceiver supportable by an Agent at the first geospatial position and in logical communication with the controller;
   d) a magnetic field sensor in logical communication with the controller; and
   e) executable code stored on the digital storage and executable by the processor to cause the controller to:
   f) generate respective logical communications between the first transceiver and each of a first set of three reference point transceivers, the three reference point transceivers fixedly positioned at disparate points in the structure;
   g) determine X, Y and Z coordinates of the first transceiver based upon the respective logical communications between the first transceiver and each of a first set of three reference point transceivers;
   h) generate respective logical communications between the second transceiver and each of a second set of three reference point transceivers;
   i) determine X, Y and Z coordinates of the second transceiver based upon the respective logical communications between the first transceiver and each of a first set of three reference point transceivers;
   j) generate a first quantification of a magnetic field encompassing the smart device with a magnetic field sensor;
   k) generate a location of the smart device based upon at least one of: X, Y and Z coordinates of the first transceiver, and the X, Y and Z coordinates of the second transceiver;
   l) generate a first direction of interest based upon at least two of: the X, Y and Z coordinates of the first transceiver, the X, Y and Z coordinates of the second transceiver, and the quantification of the magnetic field encompassing the smart device;
   k) access data associated with the location of the smart device and the first direction of interest; and
   l) generate a user interface on the smart device, the user interface comprising the data associated with the location of the smart device.

12. The apparatus of claim 11 wherein the executable code stored on the digital storage and executable by the processor additionally causes the controller to generate a second quantification of the magnetic field encompassing the smart device following a reorientation of the smart device; and generate a second direction of interest based upon the second quantification of the magnetic field relative to the smart device.

13. The apparatus of claim 12 wherein the magnetic field sensor comprises a Hall Effect sensor.

14. The apparatus of claim 12 wherein one of the first transceiver and the second transceiver comprises a smart watch.

15. The apparatus of claim 12 wherein one of the first transceiver and the second transceiver comprises a smart ring.

16. The apparatus of claim 12 wherein the executable code stored on the digital storage and executable by the processor additionally causes the controller to reorient the smart device; generate a topographical representation of at least a portion of an environment within an area capable of wireless communication the smart device and generate a second direction of interest based upon the topographical representation.

17. The apparatus of claim 16 wherein the smart pointer comprises both the first transceiver and the second transceiver.

18. The apparatus of claim 11 wherein at least one of the first set of three reference point transceivers comprises a multi-modality transceiver capable of transceiving in multiple frequency bandwidths.

19. The apparatus of claim 18 wherein the multiple frequency bandwidths comprise bandwidths associated with two or more of: WiFi, Bluetooth, Ultra Wideband, infrared and ultrasonic modalities.

20. The apparatus of claim 11 wherein the direction of interest is at an angle perpendicular to a screen on the smart device.

* * * * *